United States Patent
Sawachi

(10) Patent No.: US 7,525,816 B2
(45) Date of Patent: Apr. 28, 2009

(54) WIRING BOARD AND WIRING BOARD CONNECTING APPARATUS

(75) Inventor: Youichi Sawachi, Asaka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/606,947

(22) Filed: Dec. 1, 2006

(65) Prior Publication Data

US 2007/0126123 A1    Jun. 7, 2007

(30) Foreign Application Priority Data

Dec. 1, 2005 (JP) ............................. 2005-348409

(51) Int. Cl.
*H05K 1/11* (2006.01)

(52) U.S. Cl. .................. 361/792; 361/748; 361/749; 361/751; 361/760; 361/767; 361/772; 361/779; 361/785; 361/790; 174/250; 174/256; 174/259; 174/260; 174/261; 29/840; 29/833; 29/762

(58) Field of Classification Search ......... 361/748–751, 361/760–769, 772–779, 780, 783, 785, 790, 361/792; 174/250–261; 29/840, 833, 762
See application file for complete search history.

(56) References Cited

U.S. PATENT DOCUMENTS

| | | | | |
|---|---|---|---|---|
| 3,024,343 | A | * 3/1962 | Siwakoski | 228/20.5 |
| 3,990,863 | A | * 11/1976 | Palmer | 29/764 |
| 4,159,074 | A | * 6/1979 | Basseches | 228/264 |
| 4,268,739 | A | * 5/1981 | Evans | 219/56.1 |
| 4,415,265 | A | * 11/1983 | Campillo et al. | 356/338 |
| 4,436,242 | A | * 3/1984 | Shisler et al. | 228/264 |
| 4,810,875 | A | * 3/1989 | Wyatt | 250/227.11 |
| 4,870,225 | A | * 9/1989 | Anao et al. | 174/261 |
| 4,898,117 | A | * 2/1990 | Ledermann et al. | 118/665 |
| 4,934,309 | A | * 6/1990 | Ledermann et al. | 118/50 |
| 4,997,121 | A | * 3/1991 | Yoshimura | 228/20.5 |

(Continued)

FOREIGN PATENT DOCUMENTS

| JP | 9-051161 A | 2/1997 |
|---|---|---|
| JP | 2002-280690 A | 9/2002 |

*Primary Examiner*—Tuan T Dinh
*Assistant Examiner*—Xiaoliang Chen
(74) *Attorney, Agent, or Firm*—Sughrue Mion, PLLC

(57) ABSTRACT

The present invention provides a wiring board including a first board provided with a first wiring pattern and a second board provided with a second wiring pattern while the first wiring pattern and the second wiring pattern are electrically connected, wherein the first board includes: a board insertion opening in which the second board is inserted; and a first connection pattern provided inside the board insertion opening and electrically connected to the first wiring pattern, and the second board includes: an inserting portion to be inserted into the board insertion opening of the first board; and a second connection pattern provided at a position opposed to the first connection pattern and electrically connected to the second wiring pattern in the case where the inserting portion of the second board is inserted into the board insertion opening of the first board, and further comprising: solder or brazing filler metal applied at least to a surface of one of the first connection pattern and second connection pattern; and a heat generating device which generates heat by energization and melts the solder or the brazing filler metal to connect the first connection pattern with the second connection pattern.

52 Claims, 23 Drawing Sheets

U.S. PATENT DOCUMENTS

| | | | |
|---|---|---|---|
| 5,021,630 A * | 6/1991 | Benko et al. | 219/121.64 |
| 5,048,747 A * | 9/1991 | Clark et al. | 228/180.21 |
| 5,104,689 A * | 4/1992 | Hayden et al. | 427/98.4 |
| 5,148,963 A * | 9/1992 | Hicks | 228/102 |
| 5,543,584 A * | 8/1996 | Handford et al. | 174/261 |
| 5,544,803 A * | 8/1996 | Jacks | 228/20.5 |
| 5,549,240 A * | 8/1996 | Urban | 228/264 |
| 5,560,100 A * | 10/1996 | Englert | 29/833 |
| 5,715,592 A * | 2/1998 | Mori et al. | 29/762 |
| 5,794,839 A * | 8/1998 | Kimura et al. | 228/123.1 |
| 5,857,609 A * | 1/1999 | Jacks | 228/20.5 |
| 5,927,591 A * | 7/1999 | Goins et al. | 228/264 |
| 5,996,222 A * | 12/1999 | Shangguan et al. | 29/840 |
| 6,214,218 B1 * | 4/2001 | Kawashima et al. | 210/179 |
| 6,444,923 B1 * | 9/2002 | Iriguchi et al. | 174/261 |
| 6,670,979 B2 * | 12/2003 | Inoue et al. | 347/238 |
| 7,039,454 B1 * | 5/2006 | Kaga et al. | 600/476 |
| 2003/0142194 A1 * | 7/2003 | Inoue et al. | 347/233 |
| 2003/0178403 A1 * | 9/2003 | Lemmerhirt et al. | 219/209 |
| 2006/0234521 A1 * | 10/2006 | Uchida et al. | 439/55 |
| 2006/0281343 A1 * | 12/2006 | Uchida et al. | 439/67 |

* cited by examiner

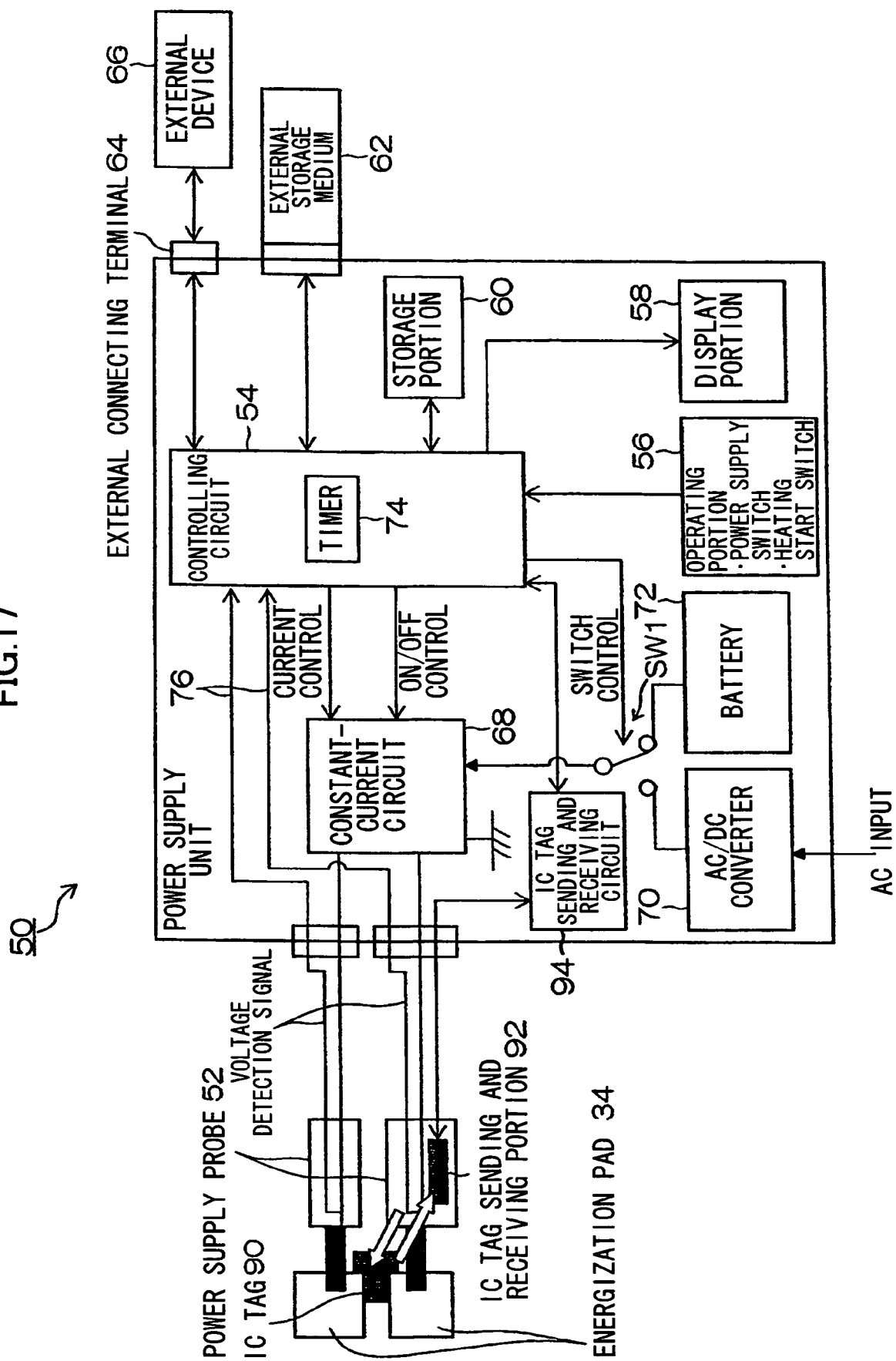

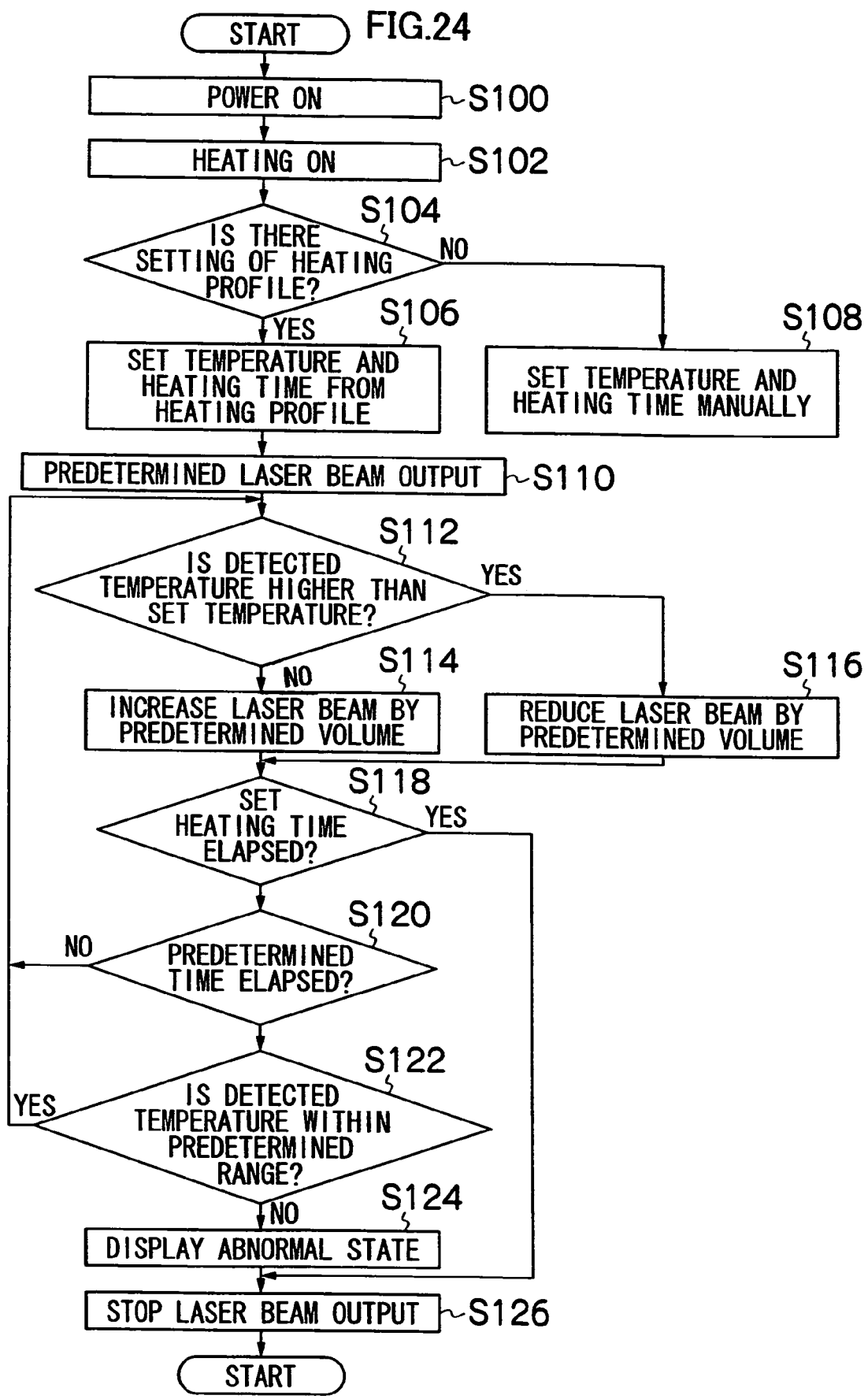

WIRING BOARD AND WIRING BOARD CONNECTING APPARATUS

BACKGROUND OF THE INVENTION

1. Field of the Invention

The present invention relates to a wiring board and a wiring board connecting apparatus, and in particular, to the wiring board configured by connecting multiple boards, and the like.

2. Description of the Related Art

Conventionally, there is a disclosure (Japanese Patent Application Laid-Open No. 2002-280690) of a coupling structure of a printed wiring board in which a notched portion is formed on the printed wiring board and a flexible printed wiring board is inserted into the notched portion so as to implement electrical continuity between a pattern on the printed wiring board and a pattern on the flexible printed wiring board. According to Japanese Patent Application Laid-Open No. 2002-280690, there is no need to provide a connector for connecting the hard printed wiring board with the flexible printed wiring board, a land for connection and the like, and so space on the printed wiring board can be effectively exploited.

According to Japanese Patent Application Laid-Open No. 2002-280690, the pattern on the printed wiring board and the pattern on the flexible printed wiring board are merely in contact, or are only in conduction because of a contact pin biased by a spring. Therefore, there was a problem as to connection strength between the printed wiring boards.

The present invention has been made in view of such circumstances, and an object thereof is to provide a wiring board and a wiring board connecting apparatus capable of mutually attaching and removing the boards with ease and connecting wiring patterns on the boards with certainty.

SUMMARY OF THE INVENTION

To attain the object, a wiring board according to a first aspect is the one including a first board provided with a first wiring pattern and a second board provided with a second wiring pattern while the first wiring pattern and the second wiring pattern are electrically connected, wherein the first board includes: a board insertion opening in which the second board is inserted; and a first connection pattern provided inside the board insertion opening and electrically connected to the first wiring pattern, and the second board includes: an inserting portion to be inserted into the board insertion opening of the first board; and a second connection pattern provided at a position opposed to the first connection pattern and electrically connected to the second wiring pattern in the case where the inserting portion of the second board is inserted into the board insertion opening of the first board, and further comprising: solder or brazing filler metal applied at least to a surface of one of the first connection pattern and second connection pattern; and a heat generating device which generates heat by energization and melts the solder or the brazing filler metal to connect the first connection pattern with the second connection pattern.

According to the first aspect, it is possible to attach and remove the first and second boards with ease and connect the first and second wiring patterns with certainty by using solder or brazing filler metal.

The wiring board according to a second aspect is the one according to the first aspect, wherein the heat generating device is provided on a backside surface of the surface provided with the second connection pattern in the inserting portion. The second aspect limits a position at which the heat generating device is provided.

The wiring board according to a third aspect is the one according to the first aspect, wherein the second board is a multilayer board having multiple layers laminated therein, and the heat generating device is provided between the multiple layers. The third aspect limits the position at which the heat generating device is provided by rendering the second board as the multilayer board.

The wiring board according to a fourth aspect is the one according to the second or third aspect, wherein the heat generating device is provided at a position overlapping the second connection pattern.

According to the fourth aspect, the heat generating device is formed to overlap the second connection pattern formed on another surface or layer so as to effectively heat the solder or the brazing filler metal for connecting the first connection pattern with the second connection pattern.

The wiring board according to a fifth aspect is the one according to the fourth aspect, wherein the heat generating device is an electrothermal pattern or a filiform heating element for generating heat by energization and is provided according to a form of the second connection pattern. The fifth aspect limits the kind of the heat generating device.

The wiring board according to a sixth aspect is the one according to the fifth aspect, wherein the electrothermal pattern or the filiform heating element is provided on the backside of the second connection pattern or in proximity thereto, and the second board is provided with a wiring of low electrical resistance for supplying electric power to the electrothermal pattern or the filiform heating element.

According to the sixth aspect, it is possible to effectively heat only the second connection pattern.

The wiring board according to a seventh aspect is the one according to the first to sixth aspects, wherein the heat generating device is grounded on operation of a circuit configured by connecting the first wiring pattern with the second wiring pattern. The wiring board according to an eighth aspect is the one according to the first to sixth aspects, wherein the heat generating device is grounded via a capacitor.

According to the seventh and eighth aspects, it is possible to avoid trouble to the operation of the circuit caused by an induced current or an induced voltage to the connection pattern due to a guide signal generated by the heat generating device induced by a signal current, a signal voltage, disturbance noise or the like passing the first and second wiring patterns on the operation of the circuit configured by connecting the first and second wiring patterns.

The wiring board according to a ninth aspect is the one according to the first to eighth aspects, further comprising a smoothing device which is formed further on an insertion end side than the second connection pattern on the surface of the second board having the second connection pattern formed thereon and heated by energization on insertion or separation to smooth the surface of the solder or the brazing filler metal attached to the first connection pattern.

According to a ninth aspect, it is possible to perform secure soldering or brazing by smoothing the solder or the brazing filler metal attached to the first connection pattern on inserting the second board.

A wiring board according to a tenth aspect is the one including a first board provided with a first wiring pattern and a second board provided with a second wiring pattern while the first wiring pattern and the second wiring pattern are electrically connected, wherein the first board includes: a board insertion opening in which the second board is inserted;

a first connection pattern provided inside the board insertion opening and electrically connected to the first wiring pattern; and a beam introduction opening for introducing a heating beam for heating the first connection pattern, and the second board includes: an inserting portion to be inserted into the board insertion opening of the first board; and a second connection pattern provided at a position opposed to the first connection pattern on the inserting portion and electrically connected to the second wiring pattern in the case where the inserting portion of the second board is inserted into the board insertion opening of the first board, and further comprising: a solder or a brazing filler metal applied at least to a surface of one of the first connection pattern and second connection pattern and heated and melted by the heating beam introduced from the beam introduction opening to connect the first connection pattern with the second connection pattern.

According to the tenth aspect, it is possible to easily attach and remove the first and second boards and securely connect the first and second wiring patterns by using the solder or the brazing filler metal.

The wiring board according to an eleventh aspect is the one according to the tenth aspect, wherein the beam introduction opening is formed on the backside of the first connection pattern on the first board. The eleventh aspect limits the position at which the beam introduction opening is formed.

The wiring board according to a twelfth aspect is the one according to the tenth aspect, wherein the beam introduction opening is formed by at least one to penetrate a wall surface of the board insertion opening of the first board, and the second board further includes a heat conduction member consisting of a highly heat-conductive material and provided on a surface facing the beam introduction opening in the case where the inserting portion of the second board is inserted into the board insertion opening of the first board. The wiring board according to the thirteenth aspect is the one according to the tenth aspect, wherein the beam introduction opening is formed by at least one to penetrate a wall surface of the board insertion opening of the first board, and the second board is a multilayer board having multiple layers laminated therein and further includes a heat conduction member consisting of a highly heat-conductive material provided to a layer inside the inserting portion.

According to the twelfth and thirteenth aspects, it is possible to heat the solder or the brazing filler metal by heating the heat conduction member with the heating beam.

The wiring board according to the fourteenth aspect is the one according to the twelfth and thirteenth aspect, wherein the heat conduction member includes at least one substance out of copper, aluminum and iron. A fourteenth aspect limits the material configuring the heat conduction member.

The wiring board according to a fifteenth aspect is the one according to the first to fourteenth aspects, further comprising a high-heat expanding member to be expanded by heating which is provided on a surface different from the surface of the second board having the second connection pattern formed thereon.

According to the fifteenth aspect, the high-heat expanding member is expanded on heating the first and second connection patterns so that the second connection pattern is pressed against or approaches the first connection pattern to allow secure soldering.

The wiring board according to a sixteenth aspect is the one according to the fifteenth aspect, wherein the high-heat expanding member includes at least one substance out of copper, aluminum, iron and ceramics. The sixteenth aspect limits the material configuring the high-heat expanding member.

The wiring board according to a seventeenth aspect is the one according to the fifteenth and sixteenth aspect, wherein the high-heat expanding member is grounded.

According to the seventeenth aspect, it is possible to avoid trouble to the operation of the circuit caused by an induced current or an induced voltage to the connection pattern due to a guide signal generated by the high-heat expanding member induced by a signal current, a signal voltage, disturbance noise or the like passing the first and second wiring patterns on the operation of the circuit configured by connecting the first and second wiring patterns.

The wiring board according to an eighteenth aspect is the one according to the first to seventeenth aspects, wherein the second board is formed by a material including the substance to be expanded by heating.

According to the eighteenth aspect, the second board is expanded on heating the first and second connection patterns so that the second connection pattern is pressed against or approaches the first connection pattern to allow secure soldering.

The wiring board according to a nineteenth aspect is the one according to the eighteenth aspect, wherein the second board contains ceramics of a high heat expansion coefficient. The nineteenth aspect limits the material configuring the second board.

The wiring board according to a twentieth aspect is the one according to the first to nineteenth aspects, wherein the first board further includes a first reinforcing pad provided inside the board insertion opening and electrically unconnected to the first wiring pattern, the second board further includes a second reinforcing pad provided at the position opposed to the first reinforcing pad and electrically unconnected to the second wiring pattern in the case where the inserting portion of the second board is inserted into the board insertion opening of the first board; and the solder or the brazing filler metal is applied to the surface of at least one of the first reinforcing pad and second reinforcing pad.

According to the twentieth aspect, it is possible to provide the reinforcing pads in addition to the connection patterns and solder or braze them so as to improve connection strength between the first and second boards.

The wiring board according to a twenty-first aspect is the one according to the first to twentieth aspects, wherein the second board further includes a heating profile transmitting device which records a heating profile on heating the solder or the brazing filler metal and transmits the heating profile to a wiring board connecting apparatus.

According to the twenty-first aspect, it is possible to automate setting of the heating profile.

The wiring board according to a twenty-second aspect is the one according to the twenty-first aspect, wherein the heating profile transmitting device is an IC tag. An twenty-second aspect limits the heating profile transmitting device to the IC tag (RFID tag).

A wiring board connecting apparatus according to a twenty-third aspect is the one comprising: a heating device which heats a connection pattern provided on a board and melts solder or brazing filler metal applied to the connection pattern; a heating profile recording device which records a heating profile on heating the solder or the brazing filler metal; and a control device which controls heat applied to the connection pattern based on the heating profile. A wiring board connecting apparatus according to a twenty-fourth aspect is the one comprising: a heating device which heats a connection pattern provided on a board and melts solder or brazing filler metal applied to the connection pattern; a heating profile receiving device which receives the heating profile from a heating profile transmitting device provided on the board; and a control device which controls heat applied to the connection pattern based on the received heating profile.

According to the twenty-third and twenty-fourth aspects, it is possible to heat the solder or the brazing filler metal according to the heating profile which is set up by considering characteristics of the first and second boards.

The wiring board connecting apparatus according to a twenty-fifth aspect is the one according to the twenty-third and twenty-fourth aspects, wherein the heating device is a power supply provided on the board for energizing the heat generating device which generates heat by energization and heats the connection pattern. The wiring board connecting apparatus according to a twenty-sixth aspect is the one according to the twenty-fourth aspect, wherein the heating device is a power supply provided on the board for energizing the heating device which generates heat by energization and heats the wiring pattern, and the heating profile receiving device is provided to a power supply probe connected to a power generation device of the board or in proximity to the power supply probe. The twenty-fifth and twenty-sixth aspects limit the heating device to the power supply which is provided on the board and energizes the heating device.

The wiring board connecting apparatus according to a twenty-seventh aspect is the one according to the twenty-fifth or twenty-sixth aspect, further comprising: a voltage measuring device which measures a voltage applied to the power generation device, and wherein the control device stops the energization to the power generation device in the case where the measured voltage is out of a predetermined range of values.

According to the twenty-seventh aspect, it is possible to stop the energization in the case where the power generation device has a fault, such as a bad connection or a short for instance.

The wiring board connecting apparatus according to a twenty-eighth aspect is the one according to the twenty-seventh aspect, further comprising a warning output device which outputs a warning when the energization stops.

According to the twenty-eighth aspect, it is possible to output warning display or warning voice on stopping the energization.

The wiring board connecting apparatus according to a twenty-ninth aspect is the one according to the twenty-third or twenty-fourth aspect, wherein the heating device is a heating beam source for introducing a heating beam to the connection pattern of the board. The wiring board connecting apparatus according to a thirtieth aspect is the one according to the twenty-ninth aspect, wherein the heating beam source includes: a laser source for generating a laser beam; and an optical fiber for radiating the laser beam via a beam introduction opening formed on the board. The twenty-ninth and thirtieth aspects limit the heating device to the heating beam source.

The wiring board connecting apparatus according to a thirty-first aspect is the one according to the thirtieth aspect, wherein an end of the optical fiber is concave.

According to the thirty-first aspect, it is possible to radiate the laser beam in a wide range by forming the end of the optical fiber to be concave.

The wiring board connecting apparatus according to a thirty-second aspect is the one according to the twenty-ninth to thirty-first aspects, wherein the optical fiber guides an infrared ray generated in a region radiated by the laser beam, and further comprising a temperature calculating device which calculates a temperature of the region radiated by the laser beam based on the infrared ray guided by the optical fiber.

According to the thirty-second aspect, it is possible to acquire the temperature of the region radiated by the laser beam.

The wiring board connecting apparatus according to a thirty-third aspect is the one according to the thirty-second aspect, wherein the temperature calculating device calculates the temperature of the region radiated by the laser beam by predetermined time, and stops radiation of the laser beam in the case where the measured temperature is out of a predetermined range of values.

According to the thirty-third aspect, it is possible to stops the radiation of the laser beam in the case of abnormal heating or in the case where the laser beam is radiated at a point other than the point to be heated.

The wiring board connecting apparatus according to a thirty-fourth aspect is the one according to the thirty-third aspect, further comprising a warning output device which outputs a warning when the radiation of the laser beam stops.

According to the thirty-fourth aspect, it is possible to output warning display or warning voice on stopping the radiation of the laser beam.

According to the present invention, it is possible to attach and remove the first and second boards with ease and connect the first and second wiring patterns with certainty by using the solder or the brazing filler metal.

BRIEF DESCRIPTION OF THE DRAWINGS

FIG. 17 is a block diagram showing the main configuration of the power supply unit corresponding to the flexible board according to the third embodiment;

FIG. 24 is the flowchart showing a processing flow of a controlling circuit 304 of the laser emission unit 300.

DETAILED DESCRIPTION OF THE PREFERRED EMBODIMENTS

Hereunder, preferred embodiments of a wiring board and a wiring board connecting apparatus according to the present invention will be described with reference to the attached drawings.

[Overall Configuration of the Wiring Board]

Figure 1:
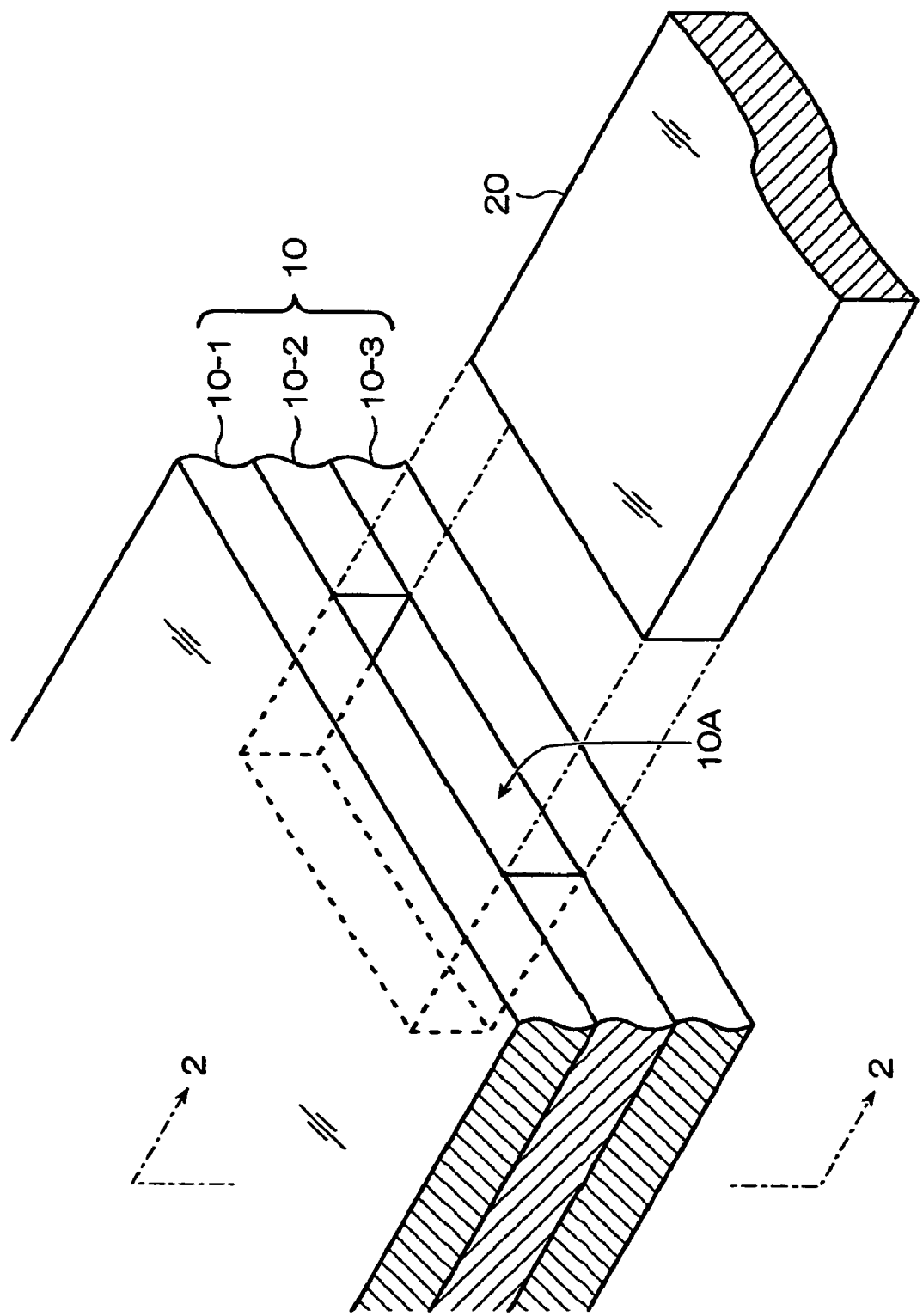
FIG. 1 is a perspective view showing the wiring board according to an embodiment of the present invention.

FIG. 1 is a perspective view showing the wiring board according to an embodiment of the present invention. As shown in FIG. 1, the wiring board of this embodiment is a flexible rigid board in which a multilayer board 10 is combined with a flexible board 20 which is detachable from the multilayer board 10. The multilayer board 10 is configured by sticking three boards 10-1, 10-2 and 10-3 together in order. The second layer 10-2 is a little thicker than the flexible board 20, and a part thereof is notched and has a board insertion opening 10A for inserting the flexible board 20 formed thereon. To facilitate insertion of the flexible board 20, an insertion end (the end to be inserted into the board insertion opening 10A) of the flexible board 20 may be a little thinner or the board insertion opening 10A may be wider toward outside.

The multilayer board 10 and flexible board 20 are given unique identification signs (such as ID numbers), one-dimensional codes, two-dimensional codes and the like so that a combination of the multilayer board 10 and flexible board 20 is identifiable.

The number of layers configuring the multilayer board 10 is not limited to three layers. Multiple board insertion openings 10A may be formed on one multilayer board 10 to allow multiple flexible boards 20 to be connected.

Figure 2A:
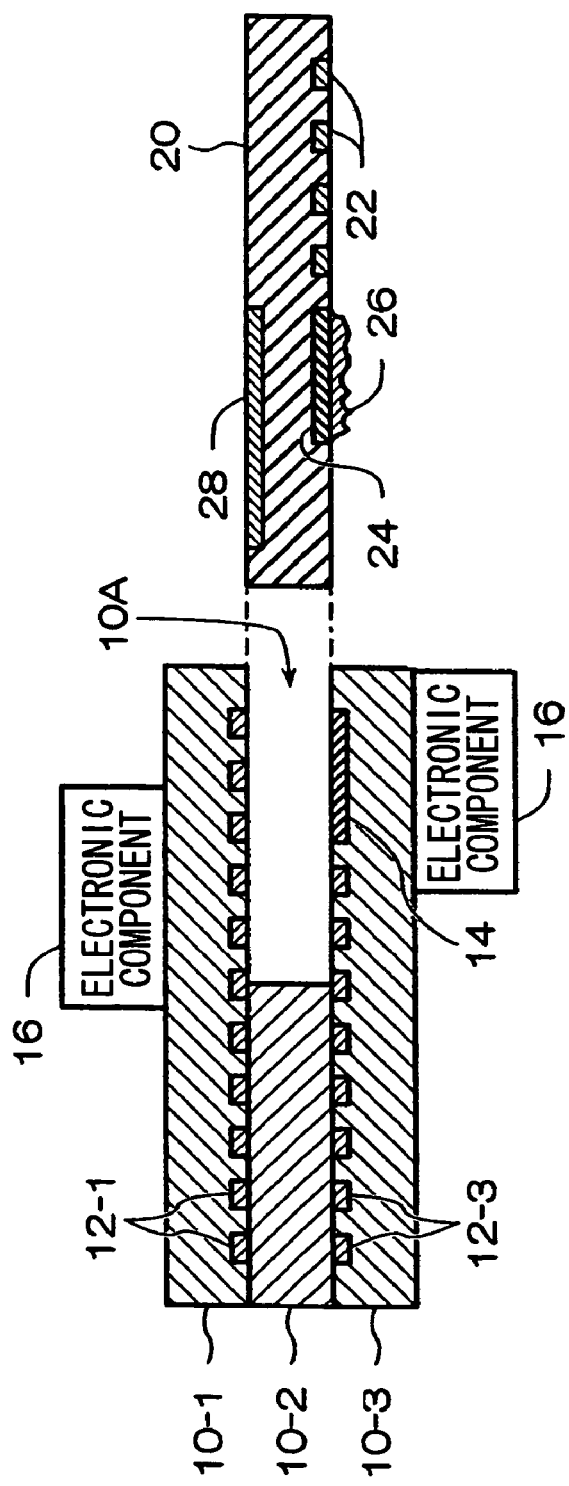
FIGS. 2A and 2B are 2 to 2 sectional views of FIG. 1.
Figure 2B:
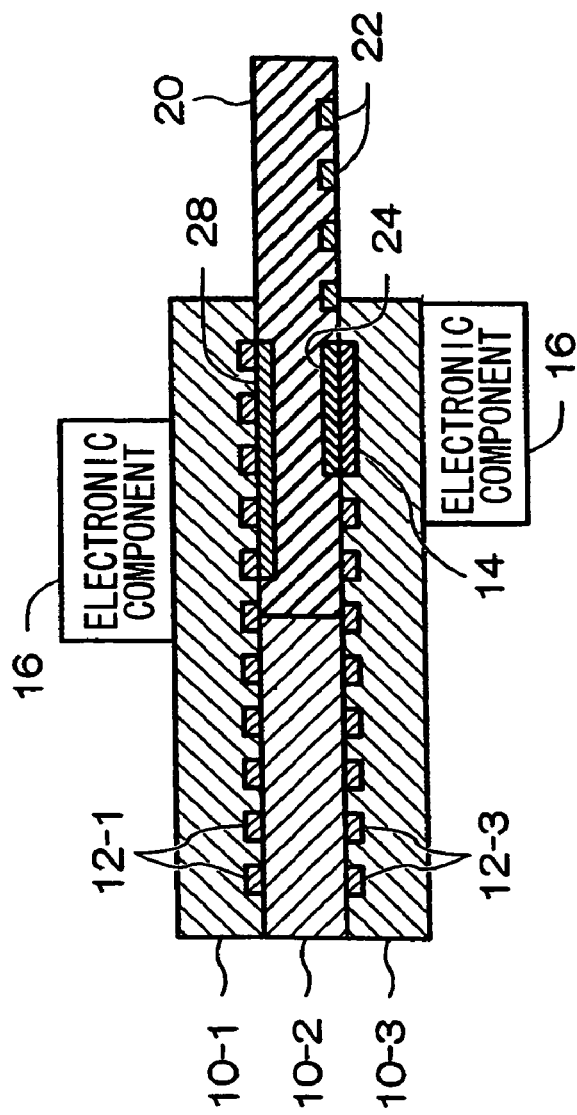

FIGS. 2A and 2B are 2 to 2 sectional views of FIG. 1. As shown in FIGS. 2A and 2B, wiring patterns 12-1 and 12-3 are formed on surfaces of the sides of the first layer 10-1 and third layer 10-3 of the multilayer board 10 stuck together with the second layer 10-2. Connection patterns 14 are formed on the surface inside the board insertion opening 10A of the third layer 10-3, which is electrically connected to the wiring pattern 12-3.

Wiring patterns not shown are formed on the surfaces outside the board insertion opening 10A of the first layer 10-1 and third layer 10-3, where electronic components 16, 16 . . . are mounted.

As shown in FIGS. 2A and 2B, a wiring pattern 22 and a connection pattern 24 are formed, on an underside of the flexible board 20. The connection pattern 24 is electrically connected to the wiring pattern 22, and a solder 26 is applied to the surface of the connection pattern 24. The solder 26 may be either applied to the surface of the connection patterns 14 of the multilayer board 10 or applied to both the connection patterns 14 and 24. A brazing filler metal which is electrically conductive and melts by heating, an electrically conductive adhesive or the like may also be used instead of the solder 26.

As shown in FIG. 2B, the connection patterns 14 of the multilayer board 10 and the connection patterns 24 of the flexible board 20 are formed to be in a mutually opposed (overlapping) positional relation in the case where the flexible board 20 is inserted into the board insertion opening 10A of the multilayer board 10.

An electrothermal pattern 28 is formed on the backside of the connection pattern 24 of the flexible board 20. The electrothermal pattern 28 is a pattern to be heated by energization, which is formed by attaching a material of a nickel-chromium system or an iron-chromium system to the surface of the flexible board 20 by coating, printing, etching, vapor deposition or the like. A mechanism for supplying a current to the electrothermal pattern 28 will be described later. The electrothermal pattern 28 may also be formed by using a material such as a filiform heating element.

Next, a procedure for connecting the multilayer board 10 with the flexible board 20 will be described with reference to FIGS. 2A and 2B and the like. In the case of connecting the multilayer board 10 with the flexible board 20, the flexible board 20 is inserted into the board insertion opening 10A of the multilayer board 10 first, and positioning is performed so that the connection patterns 14 and 24 become opposed (overlapping) as shown in FIGS. 2A and 2B. Next, the electrothermal pattern 28 is energized and heated. And then, the solder 26 applied to the surface of the connection pattern 24 is melted by the heat conducted from the electrothermal pattern 28 to the connection pattern 24 via the flexible board 20. If the energization to the electrothermal pattern 28 is stopped, the solder 26 dissipates heat and coagulates. Thus, the connection patterns 14 of the multilayer board 10 are connected with the connection patterns 24 of the flexible board 20 via the solder 26, and the wiring pattern 12-3 is electrically connected with the wiring pattern 22.

Next, a procedure for separating the multilayer board 10 from the flexible board 20 will be described with reference to FIGS. 2A, 2B and the like. In the case of separating the multilayer board 10 from the flexible board 20, the electrothermal pattern 28 is energized in a state where the multilayer board 10 is connected with the flexible board 20 (refer to FIG. 2B) first, and the solder 26 connecting the connection patterns 14 with the connection patterns 24 is melted. Next, as shown in FIG. 2A, the flexible board 20 is pulled out of the board insertion opening 10A of the multilayer board 10. Thus, the multilayer board 10 is separated from the flexible board 20.

According to this embodiment, it is possible to connect the connection patterns 14 of the multilayer board 10 with the connection patterns 24 of the flexible board 20 more securely with the solder 26 and the like and also connect the multilayer board 10 with the flexible board 20 or separate the multilayer board 10 from the flexible board 20 easily by melting the solder 26 with the electrothermal pattern 28. Furthermore, it is no longer necessary to have space for placing connectors and the like for connection of the flexible board 20 on the surface of the multilayer board 10 for mounting the electronic components 16. Therefore, it is possible to effectively exploit the space on the multilayer board 10 and flexible board 20.

As for the flexible board 20, there are various forms such as the flexible board 20 having the electronic components mounted thereon, a form having the flexible board sandwiched between hard boards and a wire harness used for connection between the flexible boards 20. However, the connection method of the wiring board of this embodiment is applicable to all the forms of the flexible board 20.

First Embodiment of the Flexible Board

Figure 3:
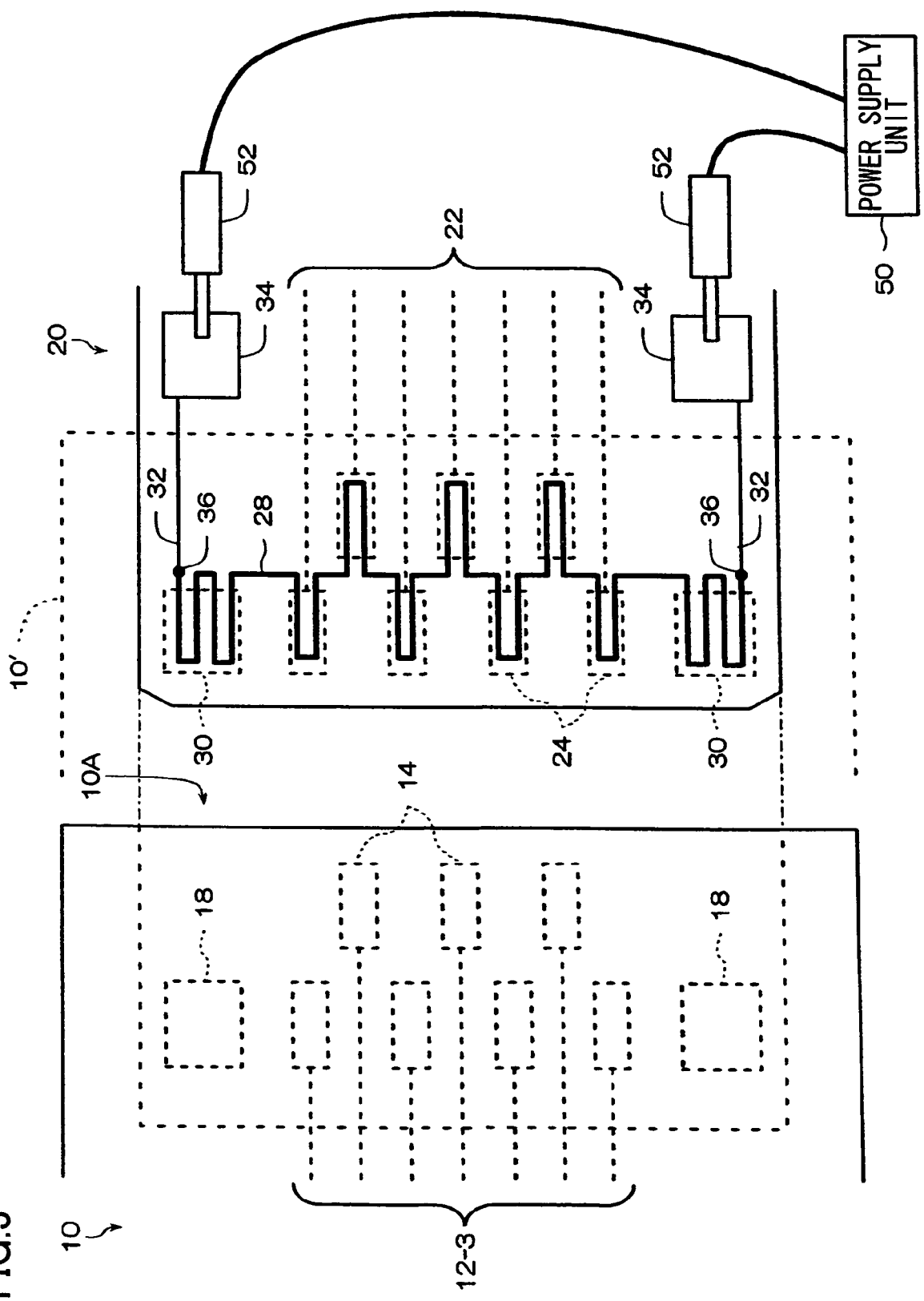
FIG. 3 is a plan view showing an electrothermal pattern 28 on a flexible board 20 according to a first embodiment of the present invention.

Next, a description will be given with reference to FIG. 3 onward as to placement of the electrothermal pattern 28 formed on the flexible boards 20 of this embodiment. FIG. 3 is a plan view showing the electrothermal pattern 28 on the flexible boards 20 according to a first embodiment of the present invention. As shown in FIG. 3, the electrothermal pattern 28 is provided according to the position of the connection pattern 24 provided on the backside of the flexible board 20. It is thereby possible to conduct heat securely to the connection pattern 24 so as to melt the solder 26 by brief energization. As the solder 26 can be melted by a minimum amount of heat, it is possible to thin the electrothermal pattern 28 and suppress a current value for energization. It is also possible to prevent the flexible board 20 and multilayer board 10 from being damaged by excessive heating.

In FIG. 3, reference numerals 18 and 30 denote reinforcing pads for reinforcing the connection between a multilayer board 30 and the flexible boards 20. The reinforcing pads 18 and 30 are the patterns formed as with the wiring patterns 12, 22 and connection patterns 14, 24 for instance, which are formed by attaching a material such as copper foil to the surface by coating, printing, etching, vapor deposition or the like, for instance. The reinforcing pads 18 are formed on the same surface on which the connection patterns 14 of the multilayer board 10 are formed. The reinforcing pads 30 are formed on the same surface on which the connection pattern 24 of the flexible board 20 is formed. The reinforcing pads 18 and 30 are formed to be in a mutually opposed positional relation in the case where the flexible board 20 is inserted into the board insertion opening 10A of the multilayer board 10.

Unlike the connection patterns 14 and 24, the reinforcing pads 18 and 30 are isolated from the wiring patterns 12-3 and 22 respectively. Solder or brazing filler metal is applied to at least one of the surfaces of the reinforcing pads 18 and 30 as with the connection patterns 14 and 24. As for the flexible board 20, the electrothermal pattern 28 is formed on the backsides of the reinforcing pads 30, and is connected by the solder or brazing filler metal melted by the electrothermal pattern 28 as with the connection patterns 14 and 24. Thus, connection strength between the multilayer board 10 and the flexible board 20 is improved.

The numbers and positions of the reinforcing pads 18 and 30 are not limited to those in FIG. 3. It is not necessary to provide the reinforcing pads 18 and 30 in the case where the connection strength between the multilayer board 10 and the flexible board 20 can be sufficiently secured by the connection of the connection patterns 14 and 24.

Figure 4:
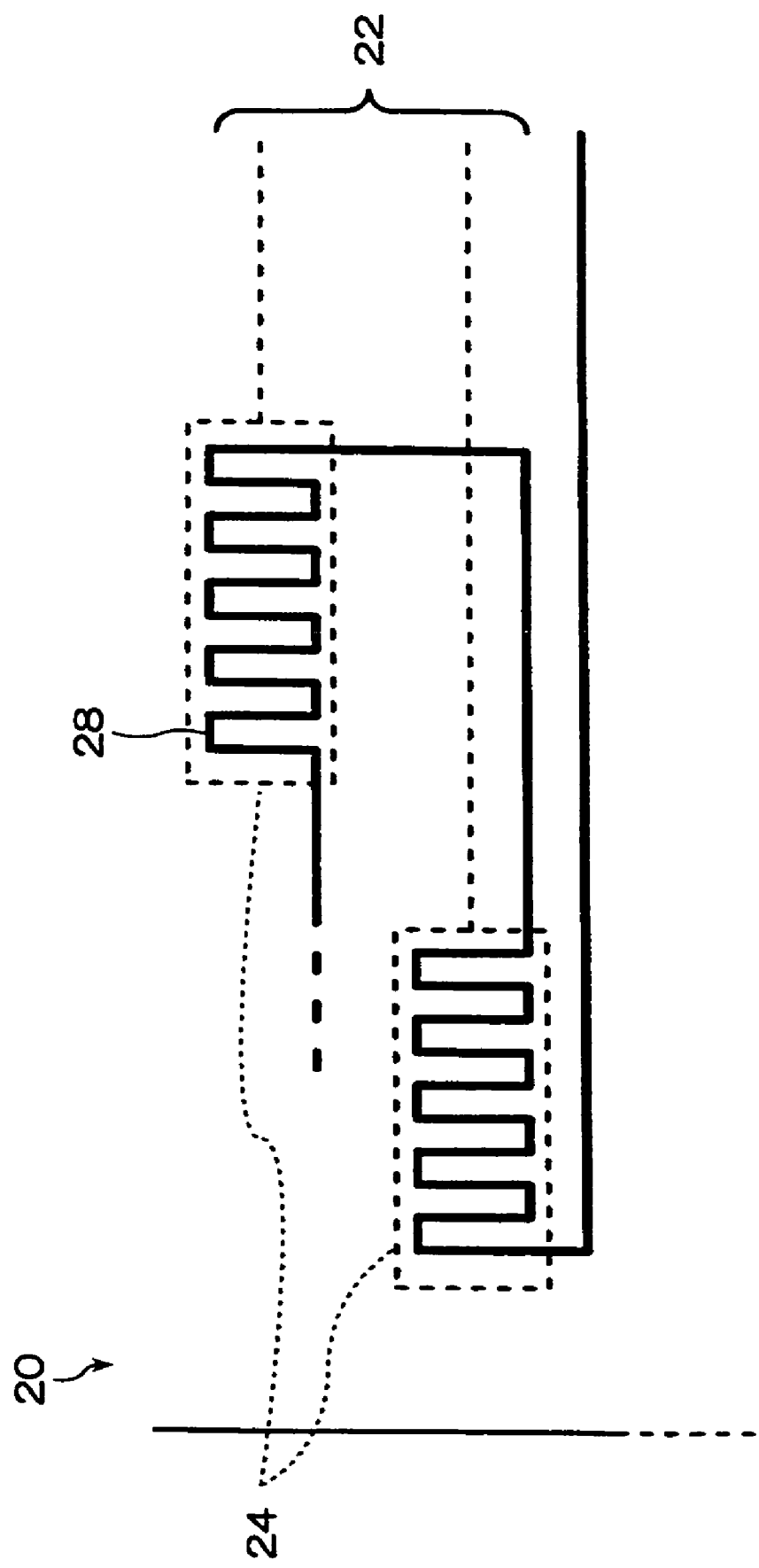
FIG. 4 is a plan view enlarging and showing a part of the electrothermal pattern 28.

As shown in FIG. 4, it is desirable to have the electrothermal pattern 28 evenly at the position corresponding to the connection patterns 24 and render length of the electrothermal pattern 28 against unit area of the connection patterns 24 or the reinforcing pads 30 equal as to each of the connection patterns 24 and the reinforcing pads 30. In the case where thickness of the flexible board 20 is not even, that is, in the case where the insertion end side of the flexible board 20 is thinner to be easily inserted into the board insertion opening 10A for instance, the length of the electrothermal pattern 28 against the unit area of the connection pattern 24 should be changed according to the thickness of the flexible board 20 (for instance, the length of the electrothermal pattern 28 overlapping the connection pattern 24 should be rendered shorter on the side where the flexible board 20 is thinner). Thus, the amount of heat conducted to each of the connection patterns 24 becomes even so that soldering reliability is improved. It is also possible to even out the amount of heat conducted to each of the connection patterns 24 by changing the thickness (pattern width and thickness) of the electrothermal pattern 28 according to the form of the connection pattern 24, thickness of the flexible board 20 and the like (by thinning the pattern width of the electrothermal pattern 28 overlapping the connection patterns 24 on the side where the flexible board 20 is thinner for instance).

Figure 5:
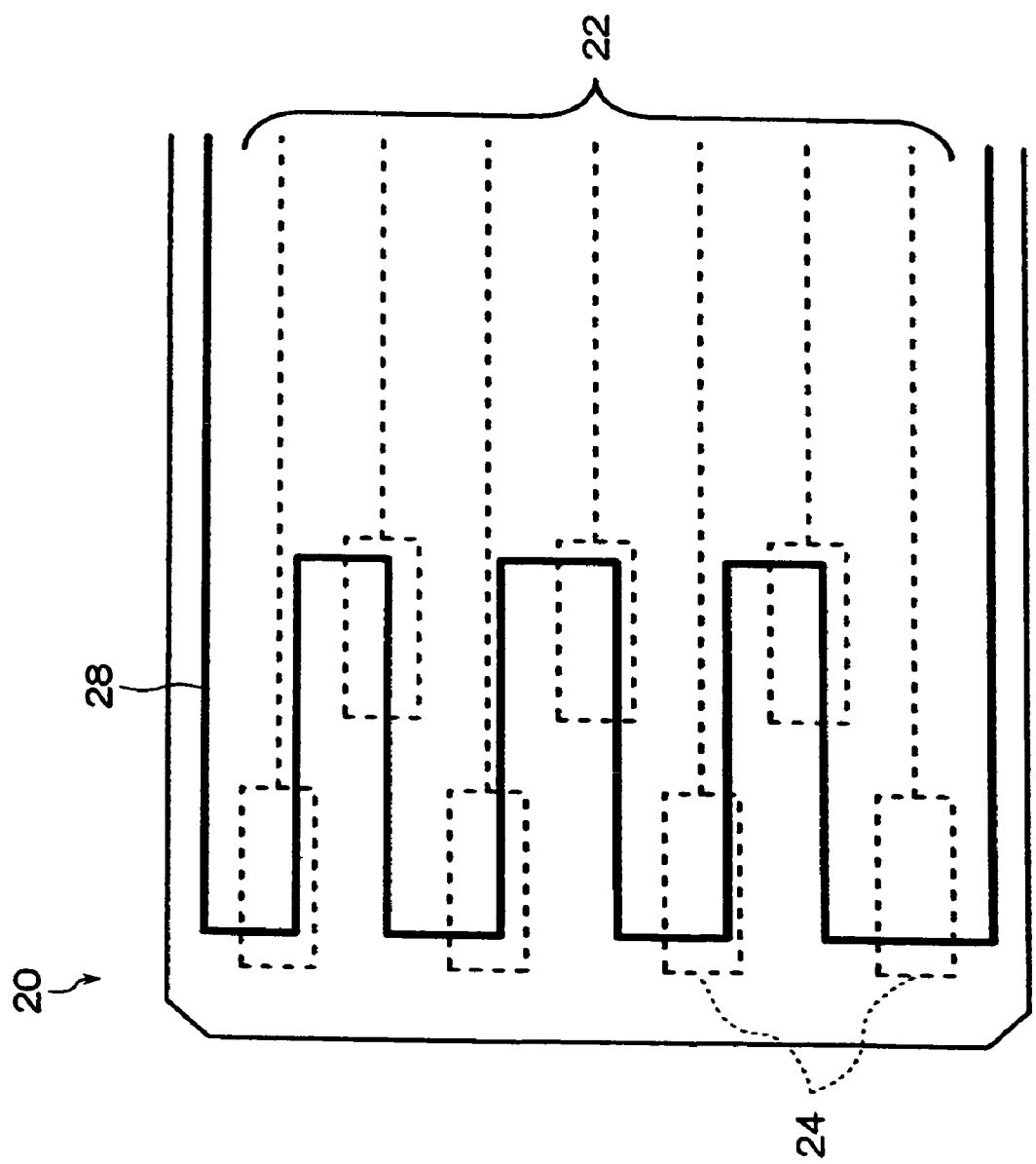
FIG. 5 is a plan view showing another example of placement of the electrothermal pattern 28.

In the case where a sufficient amount of heat is generable (in the case where tolerance against the heat of the flexible board 20 and multilayer board 10 is high) or in the case where a sufficiently large current can be passed through the electrothermal pattern 28, it is sufficient to have the electrothermal pattern 28 partially overlap the connection patterns 24 on the backside of the flexible board 20 as shown in FIG. 5.

Next, a description will be given with reference to FIG. 3 as to a route for supplying the current to the electrothermal pattern 28. As shown in FIG. 3, the electrothermal pattern 28 is connected to energization pads 34 via wiring patterns 32. The energization pads 34 are connected with power supply probes 52 of a wiring board connecting apparatus (power supply unit) 50 to have the current supplied thereto. A description will be given later as to control over the current value and voltage value supplied from the power supply unit 50 and energization time.

The wiring patterns 32 are patterns of which amount of heat by energization is small (such as a pattern consisting of a material of low electrical resistance or a copper foil pattern). To be more specific, the electrothermal pattern 28 is only formed at a position which is the backside of the connection pattern 24. It is thereby possible to prevent a loss of the applied voltage and also prevent the flexible board 20 and the multilayer board 10 from being damaged due to excessive heating because no region other than the connection pattern 24 is heated.

A connection point 36 between the electrothermal pattern 28 and the wiring patterns 32 has lower mechanical strength compared to other patterns because their materials are different. For this reason, the connection point 36 between the electrothermal pattern 28 and the wiring patterns 32 is placed inside the board insertion opening 10A in the case where the flexible board 20 is inserted into the board insertion opening 10A of the multilayer board 10 (the position of the multilayer board 10 in this case is corresponding to reference numeral 10' of FIG. 3). Thus, it is possible to prevent a crack from being generated in the electrothermal pattern 28, wiring patterns 32, connection point 36 or in proximity thereto due to a bending stress applied to the flexible board 20 and resulting in a break.

Figure 6:
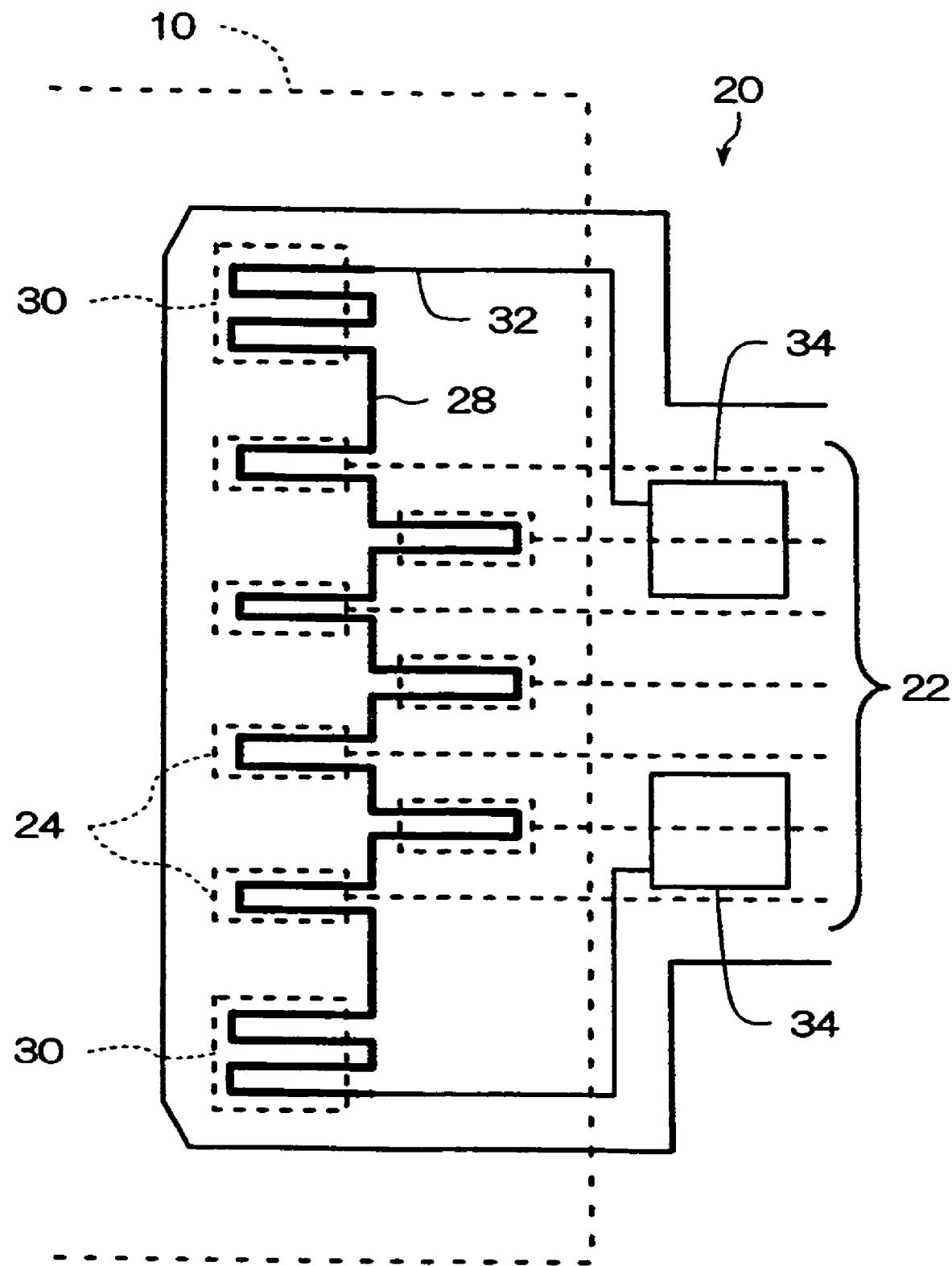
FIG. 6 is a plan view showing an example of a form of the flexible boards 20.

As for the example shown in FIG. 3, the flexible board 20 is a straight type of a constant width. As shown in FIG. 6, however, it is possible to narrow the width of the portion of the flexible board 20 not inserted into the multilayer board 10 by placing the energization pads 34 closer to the wiring pattern 22 side. It is also possible to expand the width of the portion of the flexible board 20 not inserted into the multilayer board 10.

As shown in FIG. 3 and the like, the electrothermal pattern 28 is a pattern traversing the connection pattern 24. For this reason, on operation of a circuit configured by connecting the multilayer board 10 with the flexible board 20, the electrothermal pattern 28 is apt to be induced by electrical signals of the wiring patterns 12, 22 and the like. There is a possibility that the signal generated by this induction in the electrothermal pattern 28 may have adverse effects as noise on other electrical signals. Thus, the electrothermal pattern 28 is grounded (connected to a ground or an earth) on operation of the circuit so as to reduce the effects of the noise on operation of the circuit.

Figure 7:
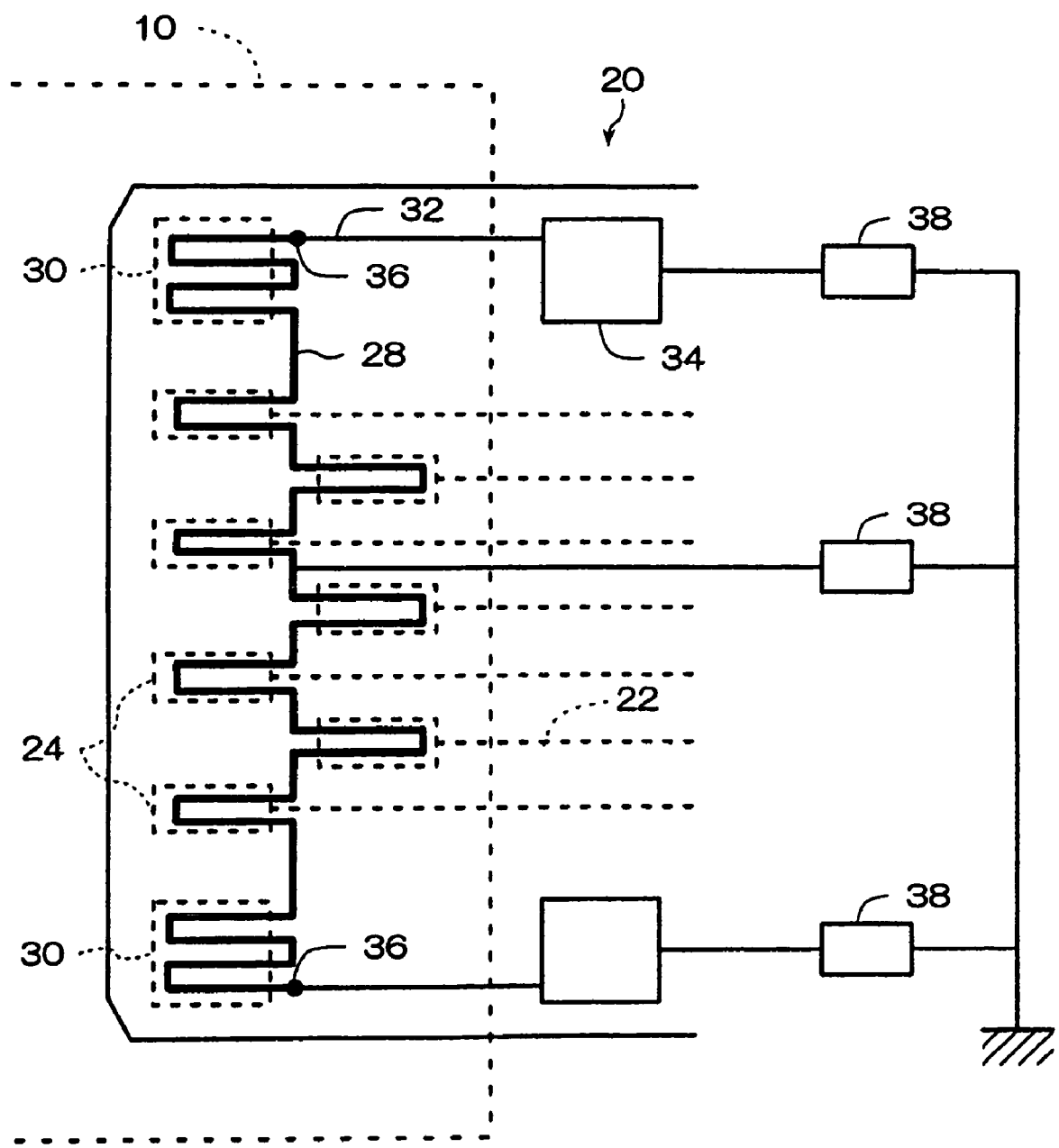
FIG. 7 is a diagram schematically showing a state of grounding the electrothermal pattern 28.

FIG. 7 is a diagram schematically showing a state of grounding the electrothermal pattern 28. As shown in FIG. 7, the electrothermal pattern 28 is grounded via a jumper component 38 (such as a 0 Ω resistance) on operation of the circuit after connecting the multilayer board 10 with the flexible board 20. On grounding the electrothermal pattern 28, the wiring patterns 32 and energization pads 34 conducting with the electrothermal pattern 28 are simultaneously grounded. It is also possible, however, to ground the wiring patterns 32 and energization pad 34 individually by considering spacing of grounding points for instance. In the case of separating the multilayer board 10 from the flexible board 20, the jumper component 38 is removed before starting the energization to the electrothermal pattern 28 so as to release the grounding.

As for the example shown in FIG. 7, the electrothermal pattern 28 is grounded at three points (grounded via the energization pad 34 at two points and directly connected to the jumper component 38 at one point). However, the number and placement of the points to be grounded are not limited thereto. When releasing the grounding, one of the jumper components 38 connected to the energization pad 34 does not have to be removed considering positive and negative of the voltage applied from the power supply unit 50. It is also possible to provide a switch between the electrothermal pattern 28 and the ground so as to release the grounding without removing the jumper component 38.

When grounding the electrothermal pattern 28, it can be grounded via a capacitor instead of the jumper component 38 shown in FIG. 7. In the case where the electrothermal pattern 28 is grounded via the capacitor, it is possible to apply the voltage to the energization pad 34 in the state of connecting the capacitor to the electrothermal pattern, 28 as-is.

According to the embodiment, the electrothermal pattern 28 was formed on the flexible board 20 side. However, the electrothermal pattern 28 may also be formed on the surface side of the multilayer board 10. In the case where the multilayer board 10 consists of four or more layers, the electrothermal pattern 28 may be provided to the layer close to the connection patterns 14.

EXAMPLE IN WHICH THE FLEXIBLE BOARD IS A MULTILAYER BOARD

Figure 8:
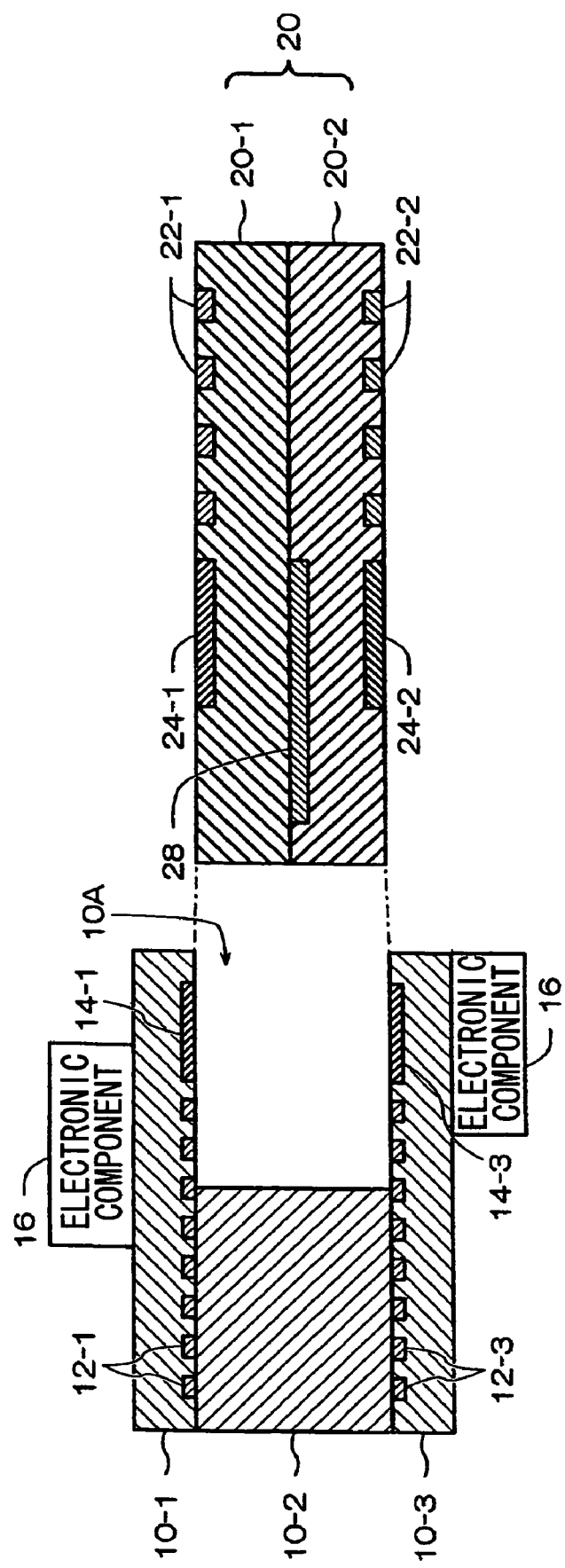
FIG. 8 is a sectional view showing an example in which the flexible board 20 is a multilayer board.

The flexible board may also be a multilayer board. FIG. 8 is a sectional view showing an example in which the flexible board 20 is a multilayer board. In the example shown in FIG. 8, the flexible board 20 is configured by sticking two boards 20-1 and 20-2 together. A wiring pattern 22-1 and a connection pattern 24-1 electrically connected to the wiring pattern 22-1 are formed on an outer surface (the backside of the surface stuck together) of the first layer 20-1. A wiring pattern 22-2 and a connection pattern 24-2 electrically connected to the wiring pattern 22-2 are formed on the outer surface (the backside of the surface stuck together) of the second layer 20-2. The multilayer board 10 has connection patterns 14-1 and 14-2 formed at the positions opposed to the connection patterns 24-1 and 24-2 respectively in the case where the flexible board 20 is inserted into the board insertion opening 10A. And the above-mentioned electrothermal pattern 28 is formed between the first layer 20-1 and the second layer 20-2.

The electrothermal pattern 28 may be formed either on the first layer 20-1 or on the second layer 20-2. As for the example shown in FIG. 8, it is possible to evenly heat the connection patterns 24-1 and 24-2 on both sides by creating a structure sandwiching the electrothermal pattern 28 between the layers.

Even in the case where the flexible board 20 is a multilayer board, it is possible to efficiently heat the connection patterns 24-1 and 24-2 on both sides by placing the electrothermal pattern 28 correspondingly to the positions of the connection patterns 24-1 and 24-2 on both sides as in FIGS. 3 and 4.

Embodiment of the Wiring Board Connecting Apparatus (Power Supply Unit)

Figure 9:
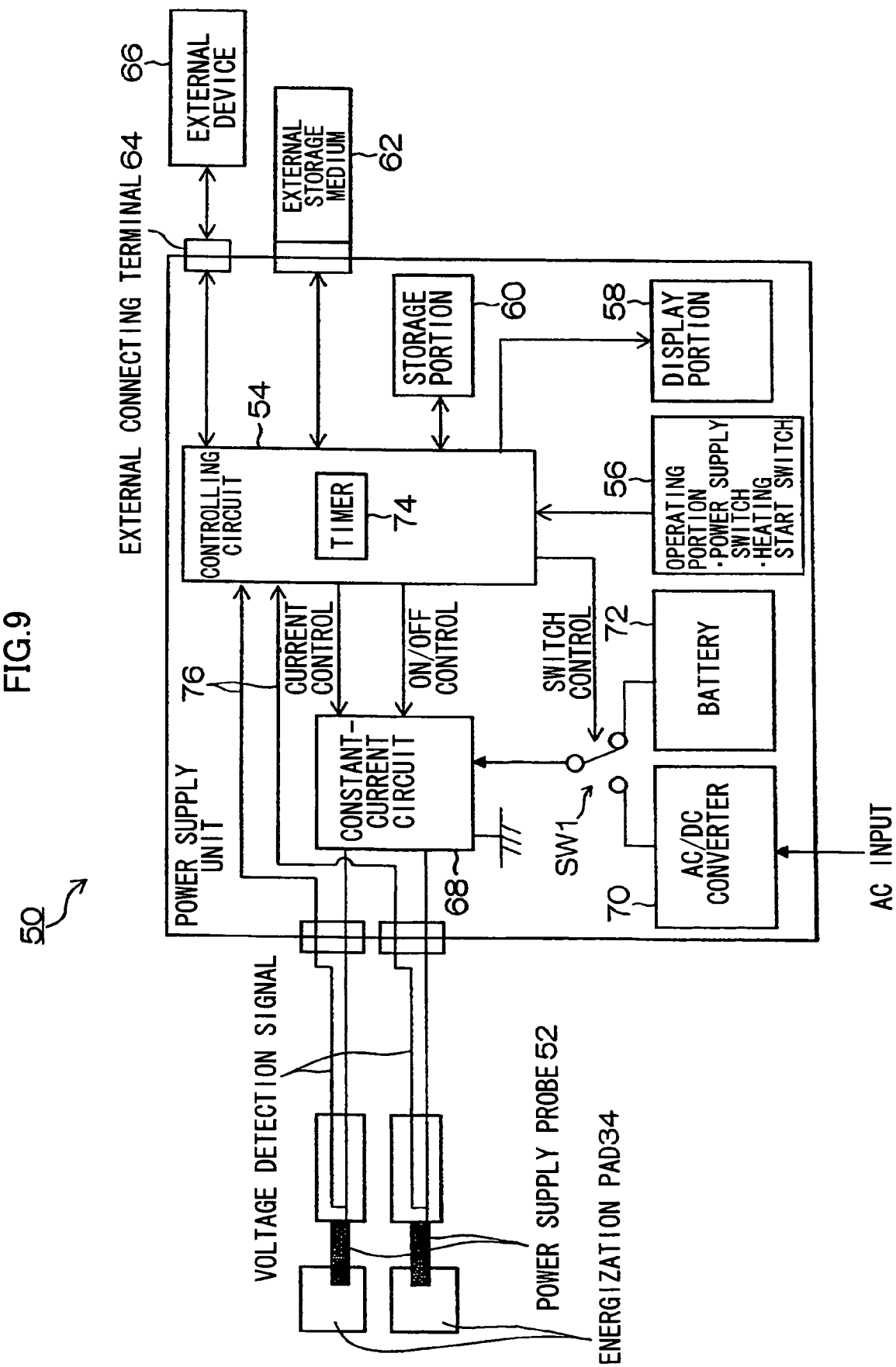
FIG. 9 is a block diagram showing a main configuration of a power supply unit 50.

Next, an embodiment of the power supply unit 50 will be described. FIG. 9 is a block diagram showing a main configuration of the power supply unit 50. As shown in FIG. 9, the power supply unit 50 includes a controlling circuit 54, an operating portion 56, a display portion 58, a storage portion 60, an external storage medium 62 and an external connecting terminal 64.

The controlling circuit 54 is a control portion for integrally controlling the power supply unit 50. The controlling circuit 54 controls the operation of the power supply unit 50 based on signal inputs from the operating portion 56 and the like. The operating portion 56 includes a power switch of the power supply unit 50, a heating start switch for starting supply of a current to the power supply probes 52 and various other operating switches. The display portion 58 is a monitor for displaying various operation menus and set contents and also displaying a warning. The storage portion 60 is an apparatus for storing data, programs and the like necessary to control the power supply unit 50, which is a memory (a non-volatile memory for instance) built into the power supply unit 50 for instance. The external storage medium 62 is a storage medium detachable from the power supply unit 50, which is a semiconductor memory such as a memory card, an optical disk such as a CD or a DVD or a magnetic disk such as an HDD for instance. The external connecting terminal 64 is an interface for communication with an external device 66 (such as a personal computer), which is a USB for instance.

As shown in FIG. 9, the power supply unit 50 further includes a constant-current circuit 68, an AC/DC converter circuit 70, a battery 72 and a power changing-over switch SW 1. The power supply unit 50 can select and use a commercial AC power supply or a built-in battery 72 as a power supply. The power supply to be used can be changed over by an operation input from the operating portion 56. If the operation input for changing over the power supply is performed from the operating portion 56, the power changing-over switch SW 1 is controlled by the controlling circuit 54 so as to change over the power supply to be used.

The AC/DC converter circuit 70 converts an AC output from the commercial AC power supply to a DC output in the case of using the commercial AC power supply as the power supply. The kind of the battery 72 may be either a primary battery or a secondary battery. In the case of using the battery 72 built into the power supply unit 50 as the power supply, it has an advantage of good portability.

The constant-current circuit 68 supplies a constant current to the energization pads 34 of the flexible board 20 via the power supply probes 52. The current supplied from the constant-current circuit 68 may be either a direct current or an alternating current. The constant-current circuit 68 can supply a constant current to the electrothermal pattern 28 irrespective of the size of a load between the energization pads 34. For this reason, a calorific value per unit length of the electrothermal pattern 28 can always be the same irrespective of the length of the electrothermal pattern 28 of the flexible board 20. Therefore, it is possible, by optimizing the current value supplied from constant-current circuit 68, to evenly heat the connection pattern 24 irrespective of the area of the connection pattern 24 on the flexible board 20 so as to maintain quality of the soldering.

The power supply probes 52 are connected with wirings 76 for detecting the voltage between the energization pads 34. The controlling circuit 54 detects a voltage value applied between the two energization pads 34, that is, applied to the electrothermal pattern 28 based on a voltage detecting signal inputted via the wirings 76. The detected voltage value is mainly used to detect a short circuit, a bad connection and the like.

The controlling circuit 54 sets the current value supplied from the constant-current circuit 68 to the power supply probes 52 and exerts on/off control over a current output. The controlling circuit 54 also includes a timer 74, and exerts the on/off control over the current output according to a count value of the timer 74 so as to control the energization time to the electrothermal pattern 28.

The current value supplied to the energization pads 34, the energization time and the like are set by the operation input from the operating portion 56. It is possible to store the current value, energization time and the like set by the operating portion 56 in the storage portion 60. It is thereby possible to use the current value, energization time and the like stored in the storage portion 60 on energization next time.

The current value supplied to the energization pads 34, the energization time and the like may be automatically set based on a heating profile stored in the external storage medium 62 or the like. Here, the heating profile is the current value or voltage value supplied to the energization pads 34 of the flexible board 20 and the energization time or the data on temporal change in the current value or voltage value, which is set according to the kind of the flexible board 20. The heating profile is calculated based on a difference in the calorific value according to the thickness, material and the like of the flexible board 20 and the pattern width, thickness, material and the like of the electrothermal pattern 28, and further based on components of the solder 26 used to connect the connection patterns 14 and 24, and the like.

When supplying the current to the electrothermal pattern 28 by using the heating profile, the kind of the flexible board 20 is specified by the operating portion 56 first. The controlling circuit 54 reads the heating profile corresponding to the specified flexible board 20 out of the external storage medium 62. It is thereby possible to set optimal current value and energization time for heating the electrothermal pattern 28.

A procedure for specifying the kind of the flexible board 20 can be as follows for instance. For instance, the flexible board 20 is given a unique identification sign (such as an ID number). On detecting that the heating start switch of the operating portion 56 is on, the controlling circuit 54 causes the display portion 58 to display an input acceptance screen for the identification sign of the flexible board 20. Next, the controlling circuit 54 determines the kind of the flexible board 20 based on the identification sign inputted by the operating portion 56 so as to read out the corresponding heating profile. The flexible board 20 may be given a barcode, a two-dimensional code or the like instead of the identification sign. And an apparatus for reading the barcode or the two-dimensional code may be mounted on the power supply unit 50 to read the barcode or the two-dimensional code and thereby specify the kind of the flexible board 20.

The heating profile may also be stored in the storage portion 60 built into the power supply unit 50 instead of the external storage medium 62. The data such as the heating profile is mutually readable and writable between the storage portion 60 and the external storage medium 62. Furthermore, the data such as the heating profile is also mutually readable and writable between the storage portion 60 and the external device 66 (such as a PC).

[Processing Flow of the Power Supply Unit]

Next, a processing flow of the controlling circuit 54 on energization will be described with reference to FIG. 10. First, the flexible board 20 is inserted into the board insertion opening 10A of the multilayer board 10, and positioning is performed so that the connection patterns 14 and 24 become opposed (overlapping) so as to mount the power supply probes 52 on the energization pads 34 of the flexible board 20. If the controlling circuit 54 detects that the power switch of the operating portion 56 is on (step S10) and the heating start switch for starting a current output of the constant-current circuit 68 is further on (step S12), it displays the acceptance screen for specifying the kind of the flexible board 20 on the display portion 58. On accepting the specification of the kind of the flexible board 20, the controlling circuit 54 determines whether or not there is the heating profile corresponding to the kind of the flexible board 20 specified by the external storage medium 62 or the like (step S14). In the case where there is the heating profile corresponding to the specified kind of the flexible board 20 (step S14: Yes), the controlling circuit 54 reads out the heating profile and sets the current value to be supplied to the electrothermal pattern 28 and energization time based on the read heating profile (step S16). In the case where the kind of the flexible board 20 is not inputted to the acceptance screen or in the case where there is no heating profile corresponding to the specified kind of the flexible board 20 (step S14: No), it displays a setting screen for setting the current value to be supplied to the electrothermal pattern 28 and energization time so as to set the current value to be supplied to the electrothermal pattern 28 and energization time based on a manual operation from the operating portion 56 (step S18).

On detecting that the heating start switch is on (step S12), the controlling circuit 54 outputs a feeble current for examining the electrothermal pattern 28 from the constant-current circuit 68 (step S20) so as to detect the voltage value applied to the electrothermal pattern 28. In the case where the detected voltage value is larger than an upper limit default (step S22: No), the connection of the electrothermal pattern 28 is insufficient and may be in an open state, and so the controlling circuit 54 displays a bad connection warning message on the display portion 58 (step S24) and stops the current output (step S34). Even if the detected voltage value is equal to or smaller than the predetermined upper limit (step S22: Yes), there is a possibility that the electrothermal pattern 28 is in a short state in the case where the value is smaller than a predetermined lower limit (step S26: No). Therefore, the controlling circuit 54 displays a short defect warning message on the display portion 58 (step S28) and stops the current output (step S34).

In the case where the detected voltage value is equal to or smaller than the predetermined upper limit (step S22: Yes) and equal to or larger than the predetermined lower limit (step S26: Yes), the controlling circuit 54 outputs the current from the constant-current circuit 68 according to the current value and energization time set in the step S16 or S18 (step S30). Thus, the solder 26 applied to the surfaces of the connection pattern 24 and the energization pads 34 of the flexible board 20 is melted. And if the set energization time elapses (step S32: Yes), the controlling circuit 54 stops the current output (step S34). Thus, the solder 26 applied to the surface of the connection pattern 24 of the flexible board 20 naturally dissipates heat and coagulates so that connections are made between the connection patterns 14 and 24 and the reinforcing pads 18 and 30 respectively.

The predetermined upper limit and predetermined lower limit of the steps S22 and S26 may also be set according to the set kind of the flexible board 20. It may also be regularly checked whether or not the voltage value is in a predetermined range of values by detecting the voltage value during the output of the current in the step S30.

When separating the multilayer board 10 from the flexible board 20, the processing from the step S10 to S32 should be performed in the state where the multilayer board 10 and the flexible board 20 are connected. And the flexible board 20 should be pulled out of the board insertion opening 10A of the multilayer board 10 to stop supplying the current at a stage where the solder 26 is sufficiently heated and melted (step S34).

Another Embodiment of the Heating Profile

Figure 10:
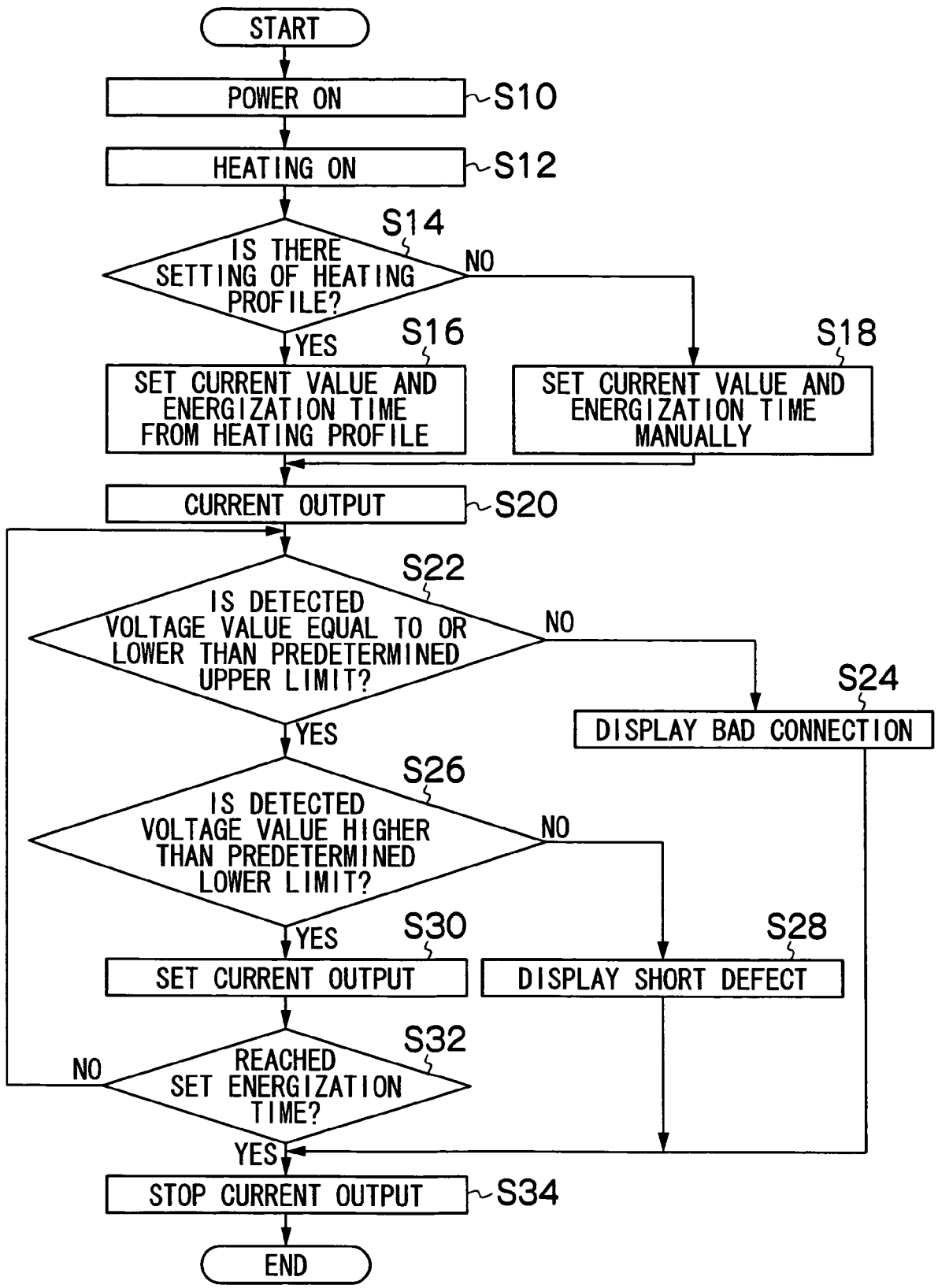
FIG. 10 is a flowchart showing a processing flow of a controlling circuit 54 of the power supply unit 50.

In the example shown in FIG. 10, a set constant current is outputted for a set energization time. However, it is also possible to set a heating profile i (t) for temporally changing the current value in the set energization time for instance. For instance, a current value i is changed stepwise by a unit time $t_1$, (several seconds to several tens of seconds for instance) as shown in FIG. 11.

Figure 11:
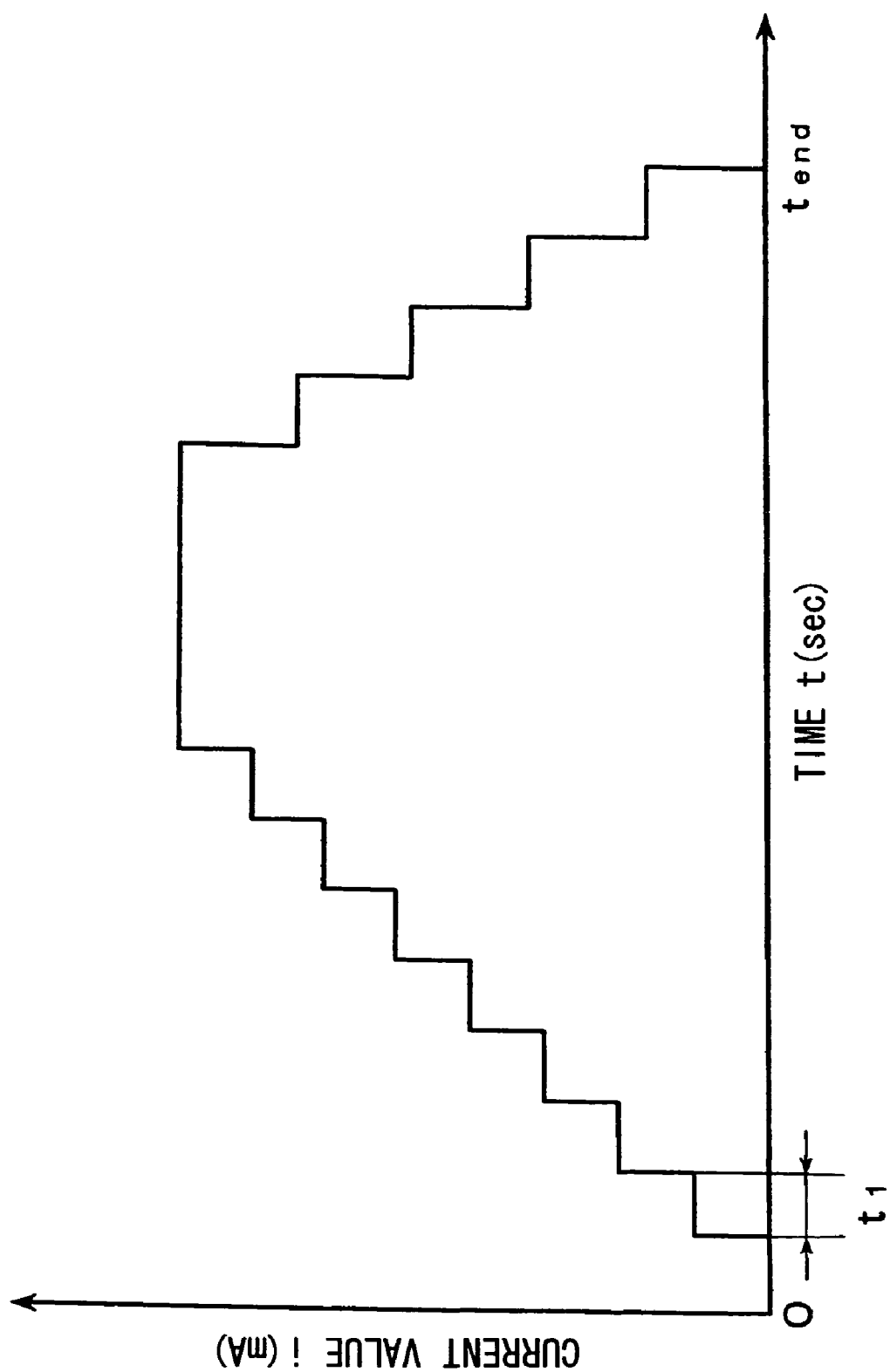
FIG. 11 is a graph showing an example of a heating profile.
Figure 12:
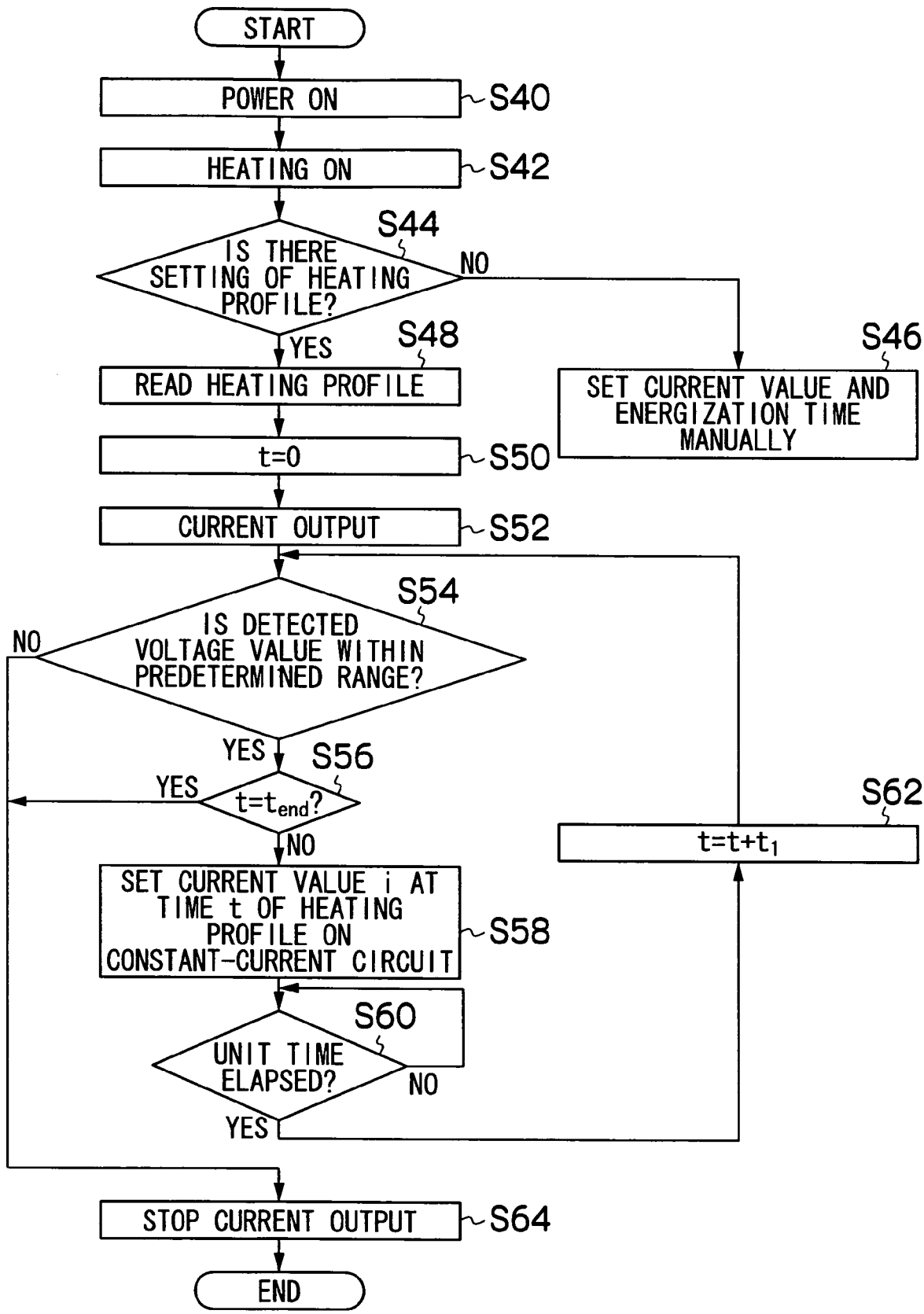
FIG. 12 is a flowchart showing the processing flow of the controlling circuit 54 of the power supply unit 50 in the case of using the heating profile shown in FIG. 11.

FIG. 12 is a flowchart showing the processing flow of the controlling circuit 54 of the power supply unit 50 in the case of using the heating profile shown in FIG. 11. First, the flexible board 20 is inserted into the board insertion opening 10A of the multilayer board 10, and positioning is performed so that the connection patterns 14 and 24 become opposed (overlapping) so as to mount the power supply probes 52 on the energization pads 34 of the flexible board 20. If the controlling circuit 54 detects that the power switch of the operating portion 56 is on (step S40) and the heating start switch for starting a current output of the constant-current circuit 68 is further on (step S42), it displays the acceptance screen for specifying the kind of the flexible board 20 on the display portion 58. On accepting the specification of the kind of the flexible board 20, the controlling circuit 54 determines whether or not there is the heating profile corresponding to the kind of the flexible board 20 specified by the external storage medium 62 or the like (step S44). In the case where the kind of the flexible board 20 is not inputted to the acceptance screen or in the case where there is no heating profile corresponding to the specified kind of the flexible board 20 (step S44: No), it displays a setting screen for setting the current value to be supplied to the electrothermal pattern 28 and energization time so as to set the current value to be supplied to the electrothermal pattern 28 and energization time based on a manual operation from the operating portion 56 (step S46). A description will be omitted as to the processing from the step S46 onward because it is the same as the steps S18 to S34 of FIG. 10 described above.

In the case where there is the heating profile corresponding to the specified kind of the flexible board 20 (step S44: Yes), the controlling circuit 54 reads out the heating profile (refer to FIG. 11) and sets the current value to be supplied to the electrothermal pattern 28 and energization time based on the read heating profile (step S48). It also resets the count value of the timer 74 of the controlling circuit 54 (t=0, step S50) and starts counting with the timer 74.

Next, the controlling circuit 54 outputs a feeble current for examining the electrothermal pattern 28 from the constant-current circuit 68 (step S52) so as to detect the voltage value applied to the electrothermal pattern 28. In the case where the detected voltage value is out of the predetermined range (step S54: No), the connection of the electrothermal pattern 28 may be insufficient and in an open state or the electrothermal pattern 28 may be in a short state, and so the controlling circuit 54 displays a bad connection or a short defect warning message on the display portion 58 according to the detected voltage value and stops the current output (step S64).

In the case where the detected voltage value is within the predetermined range (step S54: Yes), the controlling circuit 54 sets a current value i (t) at a current time t based on the heating profile i (t) of FIG. 10 and outputs the current from the constant-current circuit 68 (step S58). If the predetermined unit time $t_1$, elapses (step S60: Yes), the count time by the timer 74 becomes t=t+$t_1$ (step S62) so as to return to the step S54. The processing from the steps S54 to S62 is repeated until the count time reaches a final value $t_{end}$ of the heating profile i (t) (step S56: No) to stop the current output (step S64). Thus, the solder 26 applied to the surfaces of the connection patterns 24 and the reinforcing pads 30 of the flexible board 20 melts and then dissipates heat and coagulates so that connections are made between the connection patterns 14 and 24 and the reinforcing pads 18 and 30 respectively.

According to the examples shown in FIGS. 11 and 12, the current i is gradually increased to heat and then gradually reduced. Therefore, it is possible to prevent the components and boards of different coefficients of thermal expansion from drastically expanding and getting damaged due to a drastic temperature change. It is also possible to adjust melting and coagulation of the solder 26 to an ideal state by optimizing the heating profile.

When separating the multilayer board 10 from the flexible board 20, the processing from the steps S40 to S62 should be performed in the state where the multilayer board 10 and the flexible board 20 are connected. And the flexible board 20 should be pulled out of the board insertion opening 10A of the multilayer board 10 to stop supplying the current stepwise at a stage where the solder 26 is sufficiently heated and melted (steps S54 to S64).

Second Embodiment of the Flexible Board

Figures 13A, 13B:
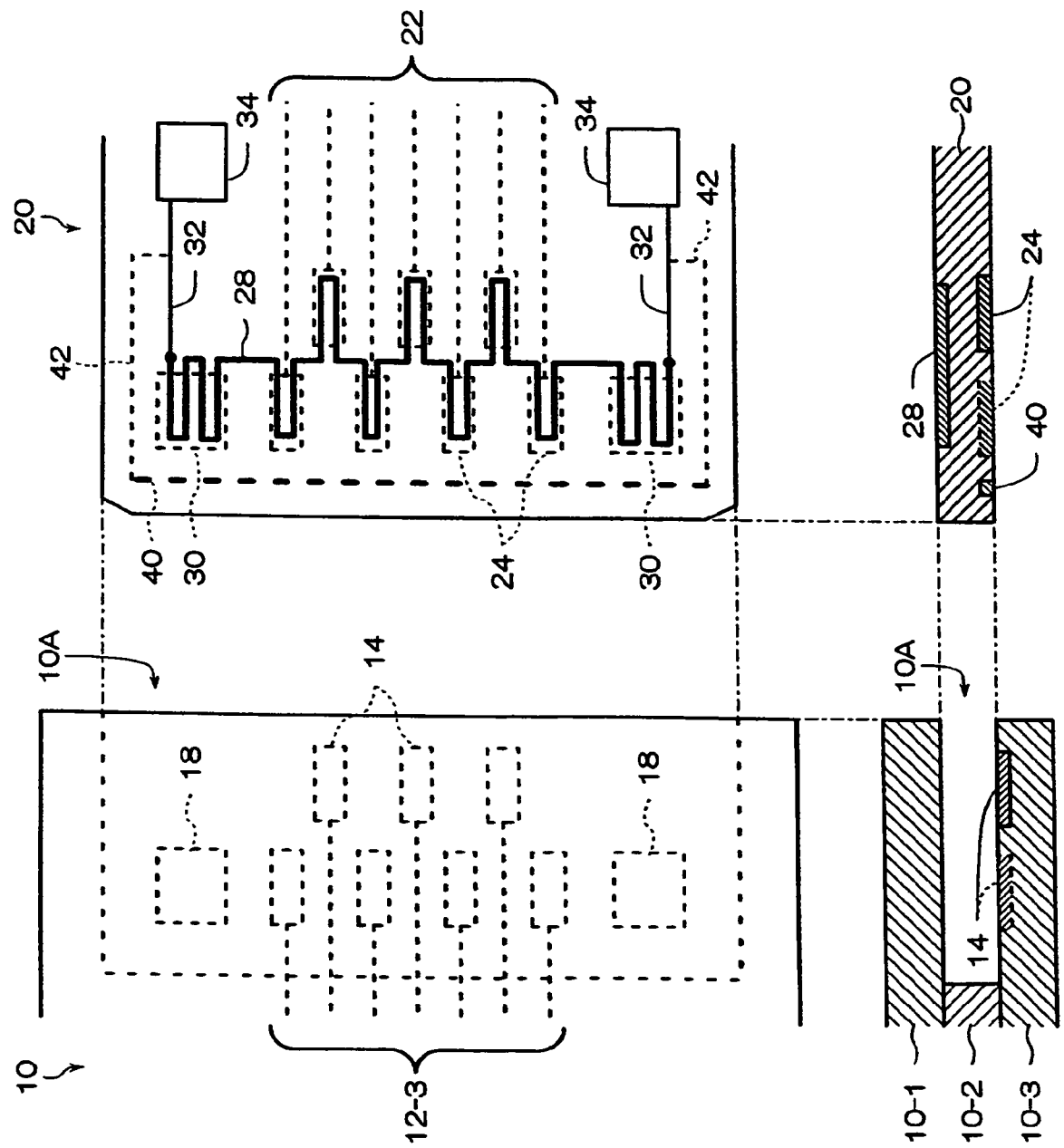
FIGS. 13A and 13B are diagrams showing the electrothermal pattern according to a second embodiment of the present invention.

FIGS. 13A and 13B are diagrams showing the electrothermal pattern according to a second embodiment of the present invention. FIG. 13A is a plan view while FIG. 13B is a sectional view. Hereunder, the same configurations as FIG. 3 described above are given the same symbols, and a description thereof will be omitted.

The flexible board 20 of this embodiment has a solder smoothing electrothermal pattern 40 formed on the surface of the side where the connection patterns 24 and the reinforcing pads 30 of the flexible board 20 are placed.

The solder smoothing electrothermal pattern 40 is used to smooth irregularities of the surface of the solder 26 attached to the surfaces of the connection patterns 14 and the reinforcing pads 18 of the multilayer board 10 in the case where the multilayer board 10 is repeatedly connected with and separated from the flexible board 20.

As shown in FIG. 13A, the solder smoothing electrothermal pattern 40 is placed on the insertion end side of the flexible board 20 to pass the corresponding connection patterns 14 and reinforcing pads 18 on the multilayer board 10 side earlier than the connection patterns 24 and the reinforcing pads 30 when the flexible board 20 is inserted into the board insertion opening 10A of the multilayer board 10. The solder smoothing electrothermal pattern 40 should desirably be in a flat form, and may be projected from the surface of the flexible board 20 further than the connection patterns 14 and reinforcing pads 18.

As shown in FIG. 13A, the solder smoothing electrothermal pattern 40 is connected to the wiring patterns 32 or the energization pad 34 via wiring patterns 42. The wiring patterns 32 or the energization pads 34 are electrically connected with the wiring patterns 42 by a through hole for instance. The wiring patterns 42 are patterns of which calorific value by energization is small (such as a pattern consisting of a material of low electrical resistance or a copper foil pattern) as with the wiring patterns 32.

When connecting the multilayer board 10 with the flexible board 20 according to this embodiment, the power supply probes 52 are mounted on the energization pads 34 of the flexible board 20 before inserting the flexible board 20 into the board insertion opening 10A. And the processing of FIG. 10 or 12 described above is performed to energize and heat the electrothermal patterns 28 and 40 in advance.

Next, the flexible board 20 is inserted into the board insertion opening 10A of the multilayer board 10, and positioning is performed so that the connection patterns 14 and 24 become opposed (overlapping) while melting and smoothing the solder 26 attached to the surfaces of the connection patterns 14 and the reinforcing pads 18 with the heat from the solder smoothing electrothermal pattern 40. And if the supply of the current to the electrothermal pattern 28 is stopped, the solder 26 dissipates heat and coagulates so that connections are made between the connection patterns 14 and 24 and the reinforcing pads 18 and 30 respectively.

According to this embodiment, it is possible to smooth the irregularities on the surface of the solder 26 attached to the surfaces of the connection patterns 14 and the reinforcing pads 18 of the multilayer board 10 by inserting the flexible board 20 into the board insertion opening 10A in the state where the solder smoothing electrothermal pattern 40 is energized and heated. Thus, secure soldering becomes possible.

According to this embodiment, when separating the multilayer board 10 from the flexible board 20, the flexible board 20 is pulled out while the electrothermal patterns 28 and 40 are in a heated state. Therefore, it is possible to smooth the solder 26 attached to the surfaces of the connection patterns 14 and the reinforcing pads 18 of the multilayer board 10.

In the example shown in FIGS. 13A and 13B, the current is supplied to the electrothermal patterns 28 and 40 from the shared energization pads 34. However, the energization pads may also be provided separately to the electrothermal patterns 28 and 40. It is thereby possible to individually heat the electrothermal patterns 28 and 40. Therefore, when inserting the flexible board 20 into the board insertion opening 10A for instance, it is possible to heat only the solder smoothing electrothermal pattern 40 and then heat the electrothermal pattern 28 by the processing of FIG. 10 or 12 after positioning the multilayer board 10 and the flexible board 20.

EXAMPLE OF THERMALLY EXPANDING THE FLEXIBLE BOARD 20

To securely connect the connection patterns 14 and 24 in the embodiment, it is desirable to press the connection patterns 24 against the connection patterns 14 on the multilayer board 10 side with a certain level of pressure when the electrothermal pattern 28 is heated by energization.

Figure 14:
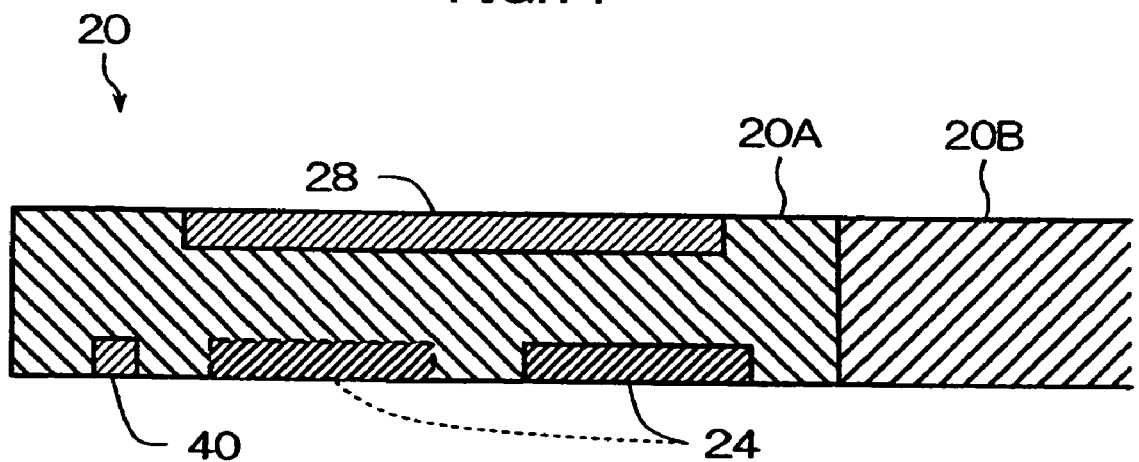
FIG. 14 is a sectional view showing an example in which the flexible board 20 is provided with a region to be expanded by heat.

FIG. 14 is a sectional view showing an example in which the flexible board 20 is provided with a region to be expanded by heat. As shown in FIG. 14, an insert 20A to be inserted into the multilayer board 10 of the flexible board 20 is formed by a board material having powder of ceramics of a high heat expansion coefficient synthesized, which is thermally expanded by heating of the electrothermal patterns 28 and 40. The thermal expansion of the flexible board 20 presses the connection patterns 24 against the connection patterns 14 on the multilayer board 10. Thus, the connection patterns 14 and 24 are securely soldered.

A high-heat expanding member should be applied at least to the range including the connection patterns 24 and the solder smoothing electrothermal pattern 40. It is also possible to render the insert 20A of the flexible board 20 as a ceramics board of a high heat expansion coefficient and render an exposed portion 20B not to be inserted into the board insertion opening 10A as a flexible board which is bendable.

Figure 15:
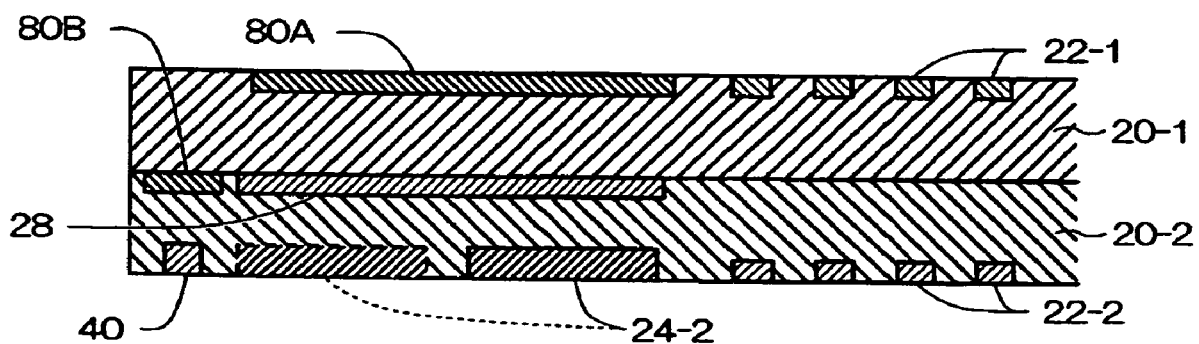
FIG. 15 is a sectional view showing an example in which the flexible board 20 as a multilayer board is provided with the region to be expanded by heat.

FIG. 15 is a sectional view showing an example in which the flexible board 20 as a multilayer board is provided with a region to be expanded by heat. In the example shown in FIG. 15, the flexible board 20 is configured by sticking the two boards 20-1 and 20-2 together. A plate-like high-heat expanding member 80A is attached to the outer surface (the backside of the surface stuck together) of the first layer 20-1. A high-heat expanding member 80B is attached between the first layer 20-1 and the second layer 20-2 at the position corresponding to the solder smoothing electrothermal pattern 40. The high-heat expanding members 80A and 80B are formed by materials of a high heat expansion coefficient like metals such as copper, aluminum or iron or patterns formed by such metals, ceramics and the like.

If the electrothermal patterns 28 and 40 are heated by energization, the high-heat expanding members 80A and 80B expand so that the solder smoothing electrothermal pattern 40 gets closer to the connection patterns 14. It is thereby possible to securely smooth the solder 26 attached to the connection patterns 14 with the solder smoothing electrothermal pattern 40. Furthermore, as the connection patterns 24 are pressed against the connection patterns 14, it is possible to securely solder the connection patterns 14 and 24.

Third Embodiment of the Flexible Board

Figure 16A:
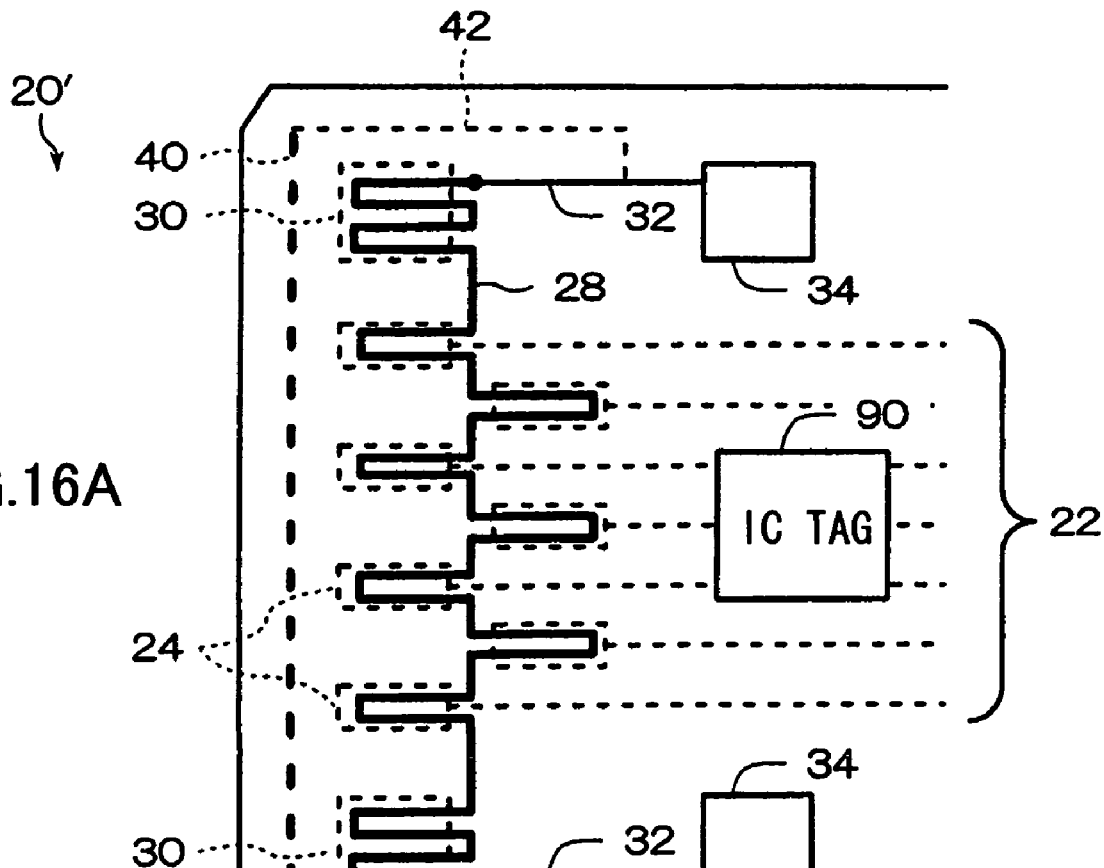
FIGS. 16A and 16B are diagrams showing the flexible board according to a third embodiment of the present invention.
Figure 16B:
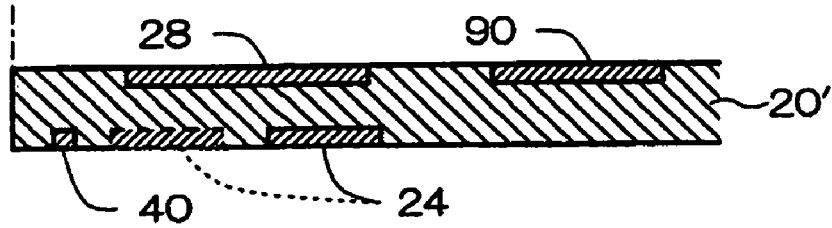

FIGS. 16A and 16B are diagrams showing the flexible board according to a third embodiment of the present invention. FIG. 16A is a plan view while FIG. 16B is a sectional view. Hereunder, the same configurations as FIGS. 13A and 13B described above are given the same symbols, and a description thereof will be omitted.

As shown in FIGS. 16A and 16B, a flexible board 20' of this embodiment has an IC tag (RFID tag) 90 mounted thereon. The above described data on the heating profile is stored in the IC tag 90.

FIG. 17 is a block diagram showing the main configuration of the power supply unit corresponding to the flexible board according to the third embodiment. Hereunder, the same configurations as FIGS. 13A, 13B and 9 described above are given the same symbols, and a description thereof will be omitted.

As shown in FIG. 17, a power supply unit 50' includes an IC tag sending and receiving portion 92 and an IC tag sending and receiving circuit 94. The IC tag sending and receiving portion 92 includes an antenna for performing radio communication with the IC tag 90 mounted on the flexible board 20. The IC tag sending and receiving circuit 94 wirelessly supplies operating power to the IC tag 90 via the IC tag sending and receiving portion 92, and also transmits a heating profile read signal. The IC tag 90 transmits the data on the heating profile to the IC tag sending and receiving portion 92 according to the read signal. The IC tag sending and receiving circuit 94 decodes the data on the heating profile received via the IC tag sending and receiving portion 92, and outputs it to the controlling circuit 54. The controlling circuit 54 controls the supply of the current from the constant-current circuit 68 based on the heating profile outputted from the IC tag sending and receiving circuit 94.

As shown in FIG. 17, the IC tag sending and receiving portion 92 is mounted on or around the power supply probe 52. For this reason, the IC tag 90 on the flexible board 20 side should desirably be mounted in proximity to the energization pads 34. It is thereby possible to send and receive the data between the IC tag sending and receiving portion 92 and the IC tag 90 in the state where the power supply probes 52 are mounted on the energization pads 34. To be more specific, the IC tag 90 should be placed in the range capable of sending and receiving in the state where the power supply probes 52 are mounted on the energization pads 34.

The IC tag sending and receiving portion 92 may be furnished independently from the power supply probes 52.

[Processing Flow of the Power Supply Unit]

Figure 18:
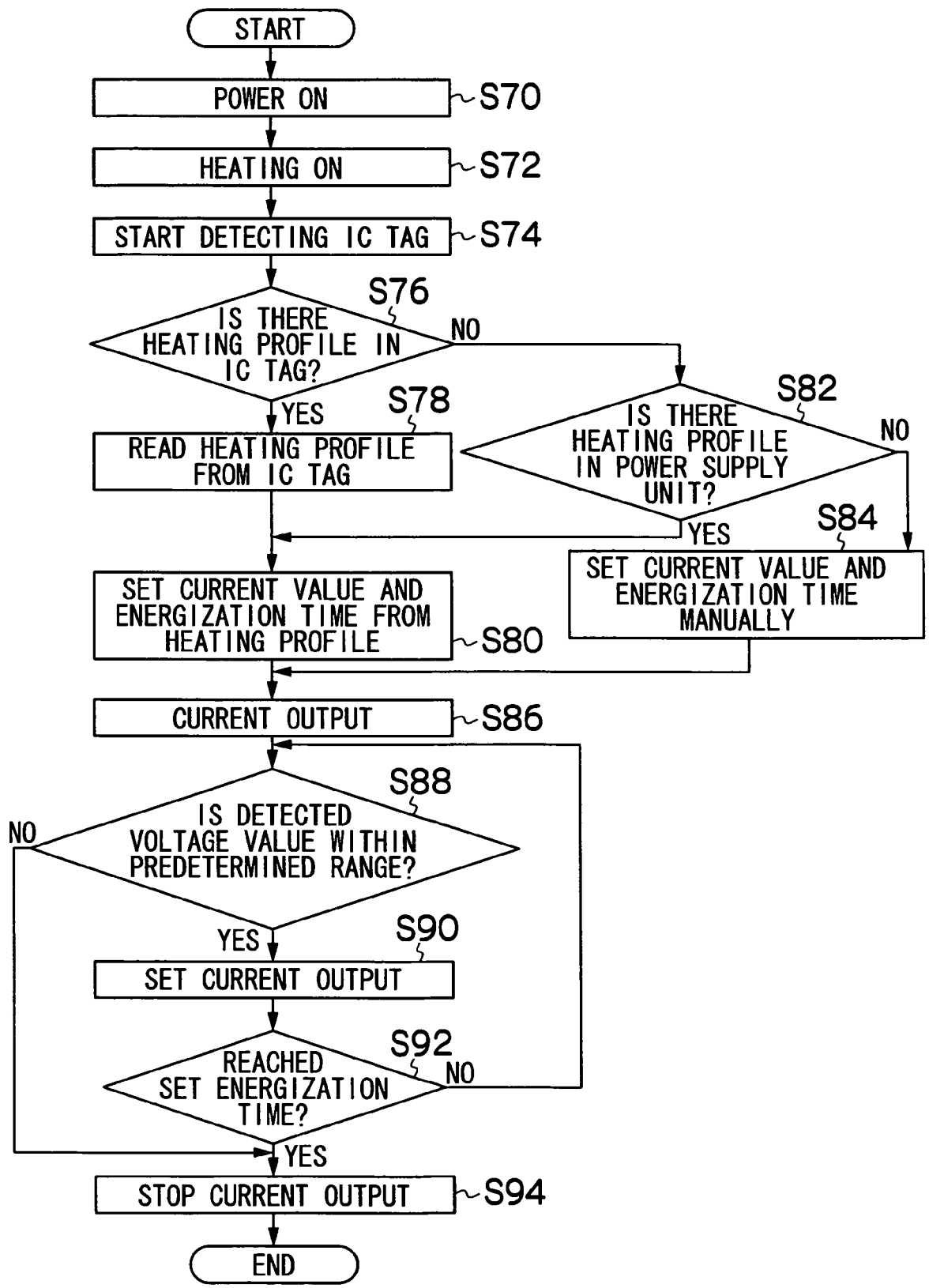
FIG. 18 is a flowchart showing a processing flow of the controlling circuit 54 of a power supply unit 50'.

Next, the processing flow of the controlling circuit 54 of the power supply unit 50' will be described with reference to FIG. 18. First, the flexible board 20 is inserted into the board insertion opening 10A of the multilayer board 10, and positioning is performed so that the connection patterns 14 and 24 become opposed (overlapping) so as to mount the power supply probes 52 on the energization pads 34 of the flexible board 20. If the controlling circuit 54 detects that the power switch of the operating portion 56 is on (step S70) and the heating start switch for starting the current output of the constant-current circuit 68 is further on (step S72), the operating power is wirelessly supplied to the IC tag 90 from the IC tag sending and receiving portion 92, and a detection signal for detecting the IC tag 90 is transmitted (step S74). In the case where the IC tag 90 is mounted on the flexible board 20, the IC tag 90 transmits a reply signal in response to the detection signal. The controlling circuit 54 detects the IC tag 90 by use of the reply signal received from the IC tag sending and receiving portion 92.

Next, if the controlling circuit 54 detects that there is the heating profile in the IC tag 90 (step S76: Yes), it reads the heating profile in the IC tag 90 (step S78) and sets the current value to be supplied to the electrothermal pattern 28 and energization time based on the read heating profile (step S80). In the case where the IC tag 90 is not detected by the detection signal or in the case where the heating profile is not detected in the IC tag 90 (step S76: No), the controlling circuit 54 subsequently displays the acceptance screen for specifying the kind of the flexible board 20 on the display portion 58. On accepting the specification of the kind of the flexible board 20, the controlling circuit 54 determines whether or not there is the heating profile corresponding to the kind of the flexible board 20 specified by the external storage medium 62 or the like (step S82). In the case where there is the heating profile corresponding to the specified kind of the flexible board 20 (step S82: Yes), the controlling circuit 54 reads out the heating profile and sets the current value to be supplied to the electrothermal pattern 28 and energization time based on the read heating profile (step S80).

In the case where the kind of the flexible board 20 is not inputted to the acceptance screen or in the case where there is no heating profile corresponding to the specified kind of the flexible board 20 (step S82: No), it displays the setting screen for setting the current value to be supplied to the electrothermal pattern 28 and energization time so as to set the current value to be supplied to the electrothermal pattern 28 and energization time based on the manual operation from the operating portion 56 (step S84).

Next, the controlling circuit 54 outputs a feeble current for examining the electrothermal pattern 28 from the constant-current circuit 68 (step S86) so as to detect the voltage value applied to the electrothermal pattern 28 (step S88). In the case where the detected voltage value is out of the predetermined range (step S88: No), the connection of the electrothermal pattern 28 may be insufficient and in an open state or the electrothermal pattern 28 may be in a short state, and so the controlling circuit 54 displays a bad connection or a short defect warning message on the display portion 58 according to the detected voltage value and stops the current output (step S94).

In the case where the detected voltage value is within the predetermined range (step S88: Yes), the controlling circuit 54 outputs the current from the constant-current circuit 68 by the current value and energization time set in the step S80 or S84 (step S90) so as to return to the processing of the step S88. Thus, the solder 26 applied to the surfaces of the connection patterns 24 and the reinforcing pads 30 of the flexible board 20 melts. And if the set energization time elapses (step S92: Yes), it stops the current output (step S94). Thus, the solder 26 applied to the surfaces of the connection patterns 24 of the flexible board 20 naturally dissipates heat and coagulates so that connections are made between the connection patterns 14 and 24 and the reinforcing pads 18 and 30 respectively.

According to this embodiment, the heating profile can be automatically set by the power supply unit 50'. Therefore, there is an advantage that, in the case where the heating profile of each kind of the flexible board 20 is different, trouble of setting the heating profile (such as inputting the identification sign of the flexible board 20) can be saved to improve operability. Furthermore, it is possible to avoid errors in setting the heating profile.

When separating the multilayer board 10 from the flexible board 20, the processing from the step S70 to S92 should be performed in the state where the multilayer board 10 and the flexible board 20 are connected. And the flexible board 20 should be pulled out of the board insertion opening 10A of the multilayer board 10 to stop supplying the current at the stage where the solder 26 is sufficiently heated and melted (step S94).

The range of the detected voltage value of the step S88 may also be set according to the set kind of the flexible board 20. It may also be regularly checked whether or not the voltage value is in the predetermined range of values by detecting the voltage value during the output of the current in the step S90.

This embodiment is also applicable to the flexible board including the heating profile i (t) shown in FIGS. 11 and 12 which is temporally changing and the solder smoothing electrothermal pattern 40 for smoothing the solder 26 attached to the connection patterns 14 and the reinforcing pads 18.

Fourth Embodiment of the Flexible Board

Figure 19A:
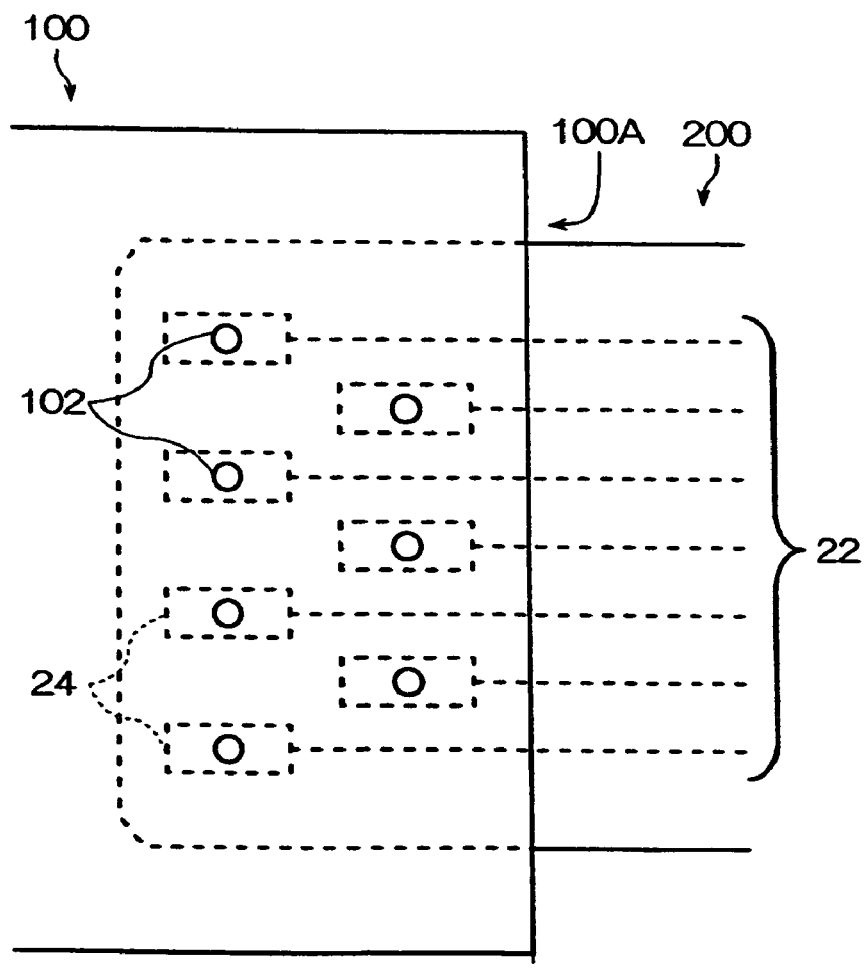
FIGS. 19A and 19B are diagrams showing the flexible board according to a fourth embodiment of the present invention.
Figure 19B:
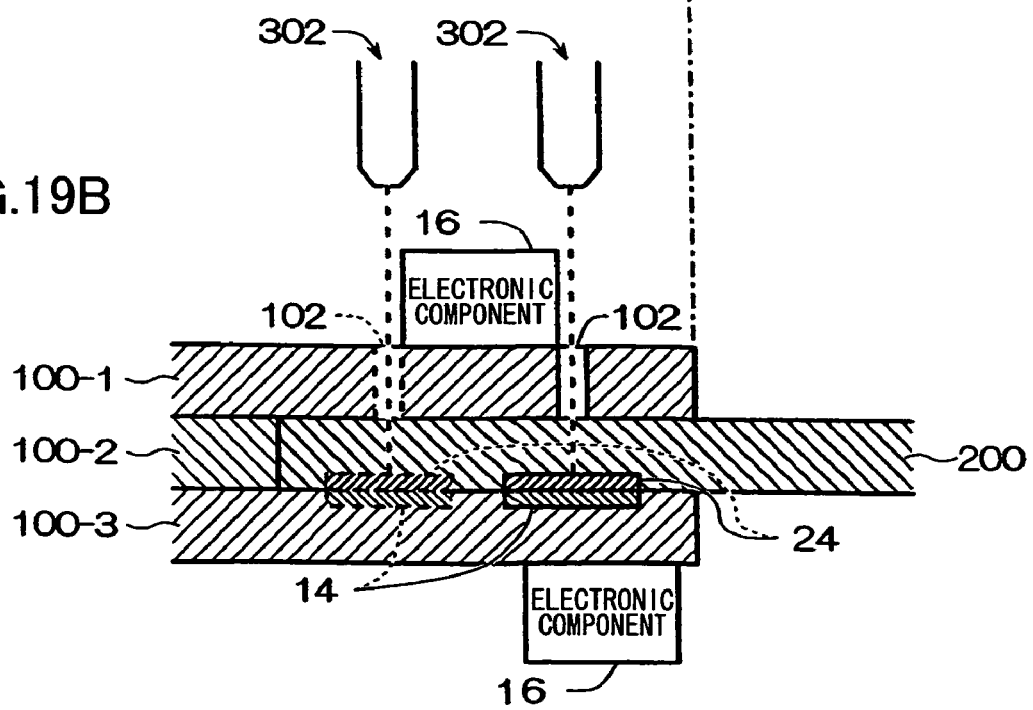

FIGS. 19A and 19B are diagrams showing the flexible board according to a fourth embodiment of the present invention. FIG. 19A is a plan view while FIG. 19B is a sectional view. Hereunder, the same configurations as FIGS. 2A and 2B described above are given the same symbols, and a description thereof will be omitted.

As shown in FIG. 19, a multilayer board 100 is configured by sticking three boards 100-1, 100-2 and 100-3 together in order. As with the above embodiment, a part of the second layer 100-2 is notched and has a board insertion opening 100A for inserting a flexible board 200 formed thereon.

As shown in FIGS. 19A and 19B, the first layer 100-1 of the multilayer board 100 has a beam introduction opening 102 formed thereon correspondingly to the positions of the connection patterns 24 on inserting the flexible board 200. As shown in FIG. 19B, the beam introduction opening 102 penetrates the first layer 100-1 from its surface to the board insertion opening 100A. The beam introduction opening 102 should be of a size not intercepting a laser beam.

In the case of connecting the multilayer board 100 with the flexible board 200, the flexible board 200 is inserted into the board insertion opening 100A of the multilayer board 100 first as shown in FIG. 19B, and positioning is performed so that the connection patterns 14 and 24 become opposed (overlapping). In this case, the connection patterns 14, 24 and the beam introduction opening 102 are arranged in alignment. Next, the laser beam is radiated from a beam radiation opening 302 of 300 (refer to FIG. 22) via the beam introduction opening 102. The radiated laser beam transmits through the flexible board 200 to reach the connection patterns 24. And then the connection patterns 24 are heated so that the solder applied to the surfaces of the connection patterns 24 is melted. And if the radiation of the laser beam is stopped, the solder dissipates heat and coagulates. The connection patterns 14 and 24 are connected via the solder 28, and the wiring patterns formed on the multilayer board 100 and the flexible board 200 are electrically connected.

In the case of separating the multilayer board 100 from the flexible board 200, the radiation of the laser beam is started first in the state where the multilayer board 100 and the flexible board 200 are connected (refer to FIG. 19B). The solder connecting the connection patterns 14 with the connection patterns 24 is melted. Next, the flexible board 200 is pulled out of the board insertion opening 100A of the multilayer board 100. Thus, the multilayer board 100 is separated from the flexible board 200.

Fifth Embodiment of the Flexible Board

Figure 20A:
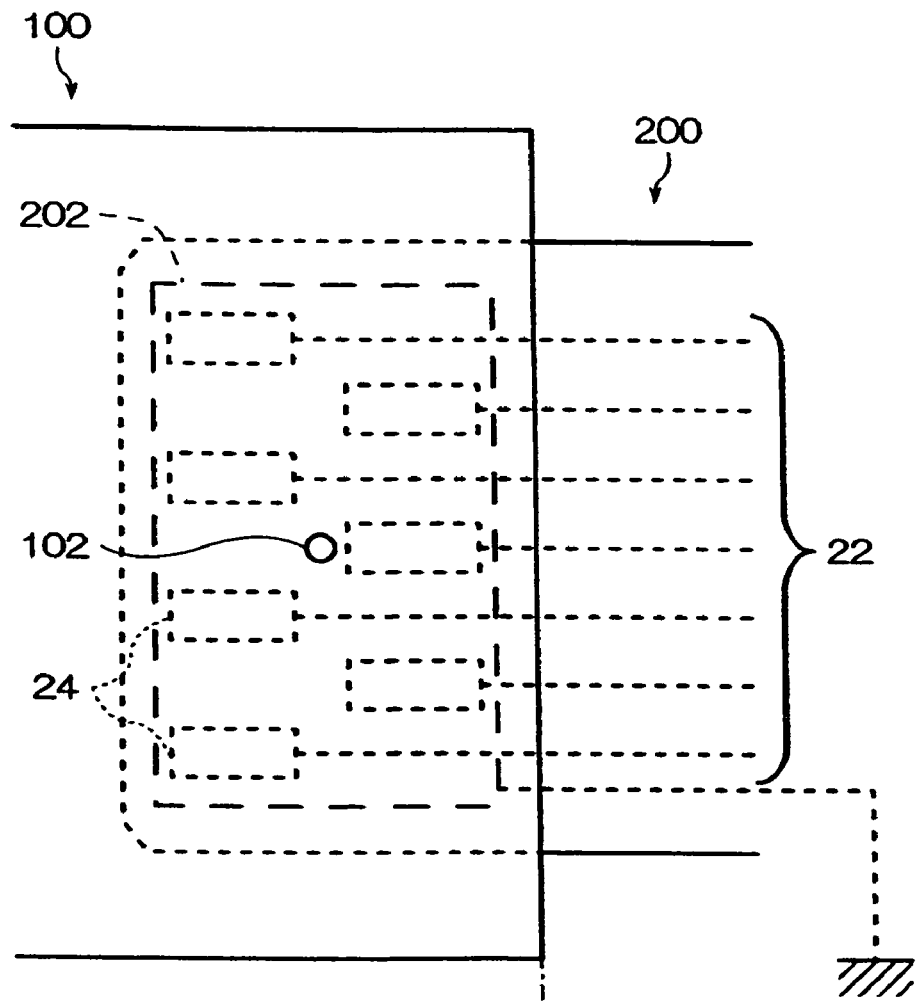
FIGS. 20A and 20B are diagrams showing the flexible board according to a fifth embodiment of the present invention.
Figure 20B:
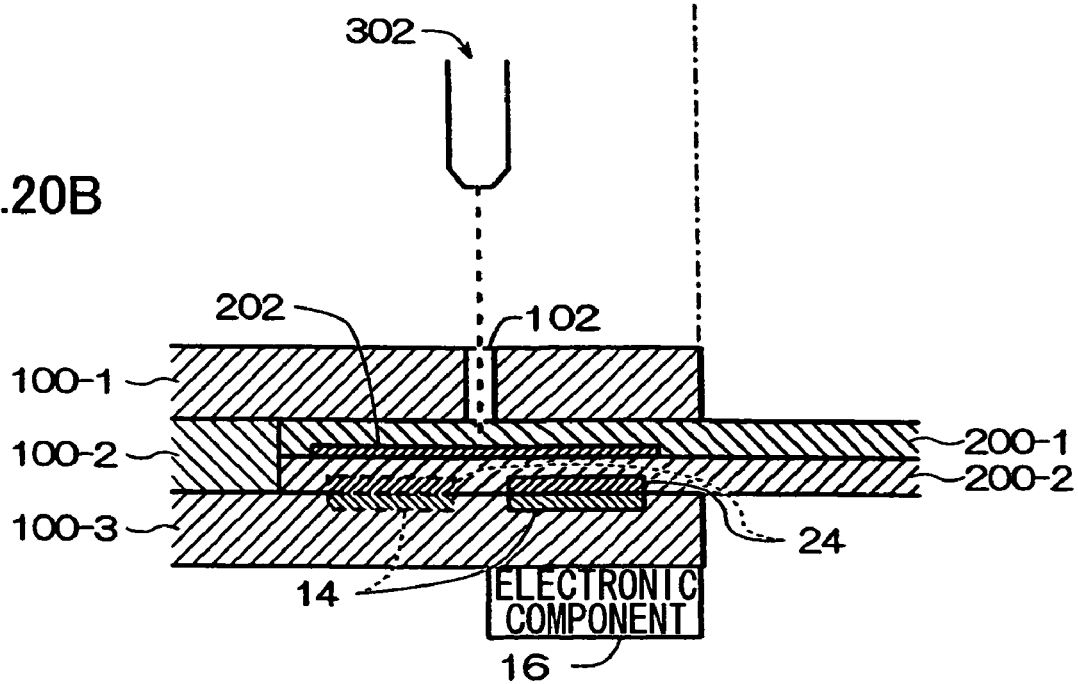

FIGS. 20A and 20B are diagrams showing the flexible board according to a fifth embodiment of the present invention. FIG. 20A is a plan view while FIG. 20B is a sectional view. Hereunder, the same configurations as FIGS. 19A and 19B described above are given the same symbols, and a description thereof will be omitted.

In the example shown in FIG. 20B, the flexible board 200 of this embodiment is configured by sticking two boards 200-1 and 200-2 together. A highly heat-conductive member 202 of which coefficient of thermal conductivity is high is formed between the first layer 200-1 and the second layer 200-2 of the flexible board 200. The highly heat-conductive member 202 is formed by materials of a high coefficient of thermal conductivity like metals such as copper, aluminum or iron or patterns and the like formed by such metals. The highly heat-conductive member 202 should desirably be placed to cover the area where the connection patterns 24 are formed.

As shown in FIG. 20A, the multilayer board 100 of this embodiment has one beam introduction opening 102 formed thereon. The beam introduction opening 102 is formed approximately at the center position of the highly heat-conductive member 202 when the flexible board 200 is inserted into the board insertion opening 100A.

According to this embodiment, the highly heat-conductive member 202 is radiated with the laser beam and heated via the beam introduction opening 102. And the solder applied to the surfaces of the connection patterns 24 is melted by the heat conducted from the highly heat-conductive member 202.

According to this embodiment, the connection patterns 24 can be mounted on both sides of the flexible board 200.

In the case where the highly heat-conductive member 202 includes a conductive substance such as a copper foil pattern, it is desirable to ground the highly heat-conductive member 202. It is thereby possible to reduce the effects of the noise generated on operation of the circuit.

In FIGS. 19A, 19B, 20A, and 20B the wiring patterns formed on the multilayer board 100 and the flexible board 200 are omitted in order to avoid complication of the drawings.

Figure 21:
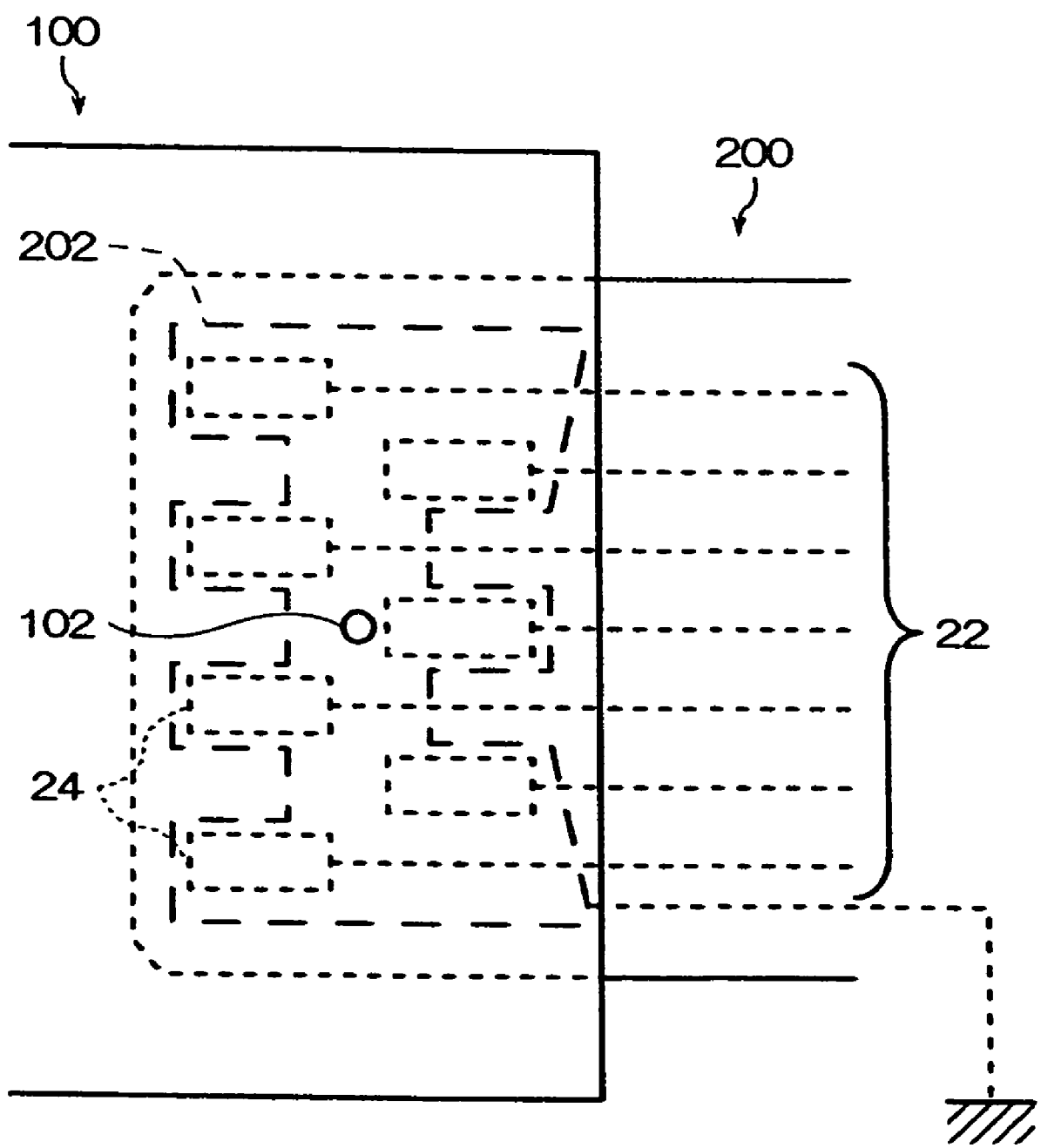
FIG. 21 is a plan view showing an example of the form of a highly heat-conductive member 202.

In the case where the central portion of the highly heat-conductive member 202 is heated, temperature of the central portion becomes higher than that in a surrounding part. Thus, there is a tendency that the temperature of the surrounding part lowers first in the cased where the heating is stopped. Therefore, the coagulation of the solder applied to the connection patterns 24 starts from the connection patterns 24 equivalent to the surrounding part of the highly heat-conductive member 202. The closer to the central portion the connection patterns 24 are, the slower the coagulation of the solder becomes. For this reason, it is desirable that the area of the surrounding part of the highly heat-conductive member 202 be larger than the area of its central portion as shown in FIG. 21. Thus, the temperature of the whole area can be uniformized by extending heat storage time after stopping the heating. As the coagulation of the solder does not become even, a stress is applied to the flexible board 200 so that twisting and lifting are apt to occur to avoid defective soldering.

In the examples shown in FIGS. 20A, 20B and 21, it is possible to use a high-heat expanding member which is highly heat-conductive and highly heat-expanding as the highly heat-conductive member 202. It is also possible, as in the example shown in FIG. 14, to configure the inserting portion of the flexible board 200 by including the high-heat expanding member. It is thereby possible, as in the examples shown in FIGS. 14 and 15, to press the connection patterns 24 against the connection patterns 14 so as to allow secure soldering.

It is also possible to provide the wiring board of this embodiment with the reinforcing pads 18, 30 and the solder smoothing electrothermal pattern 40 described above.

Embodiment of the Wiring Board Connecting Apparatus (Laser Emission Unit)

Figure 22:
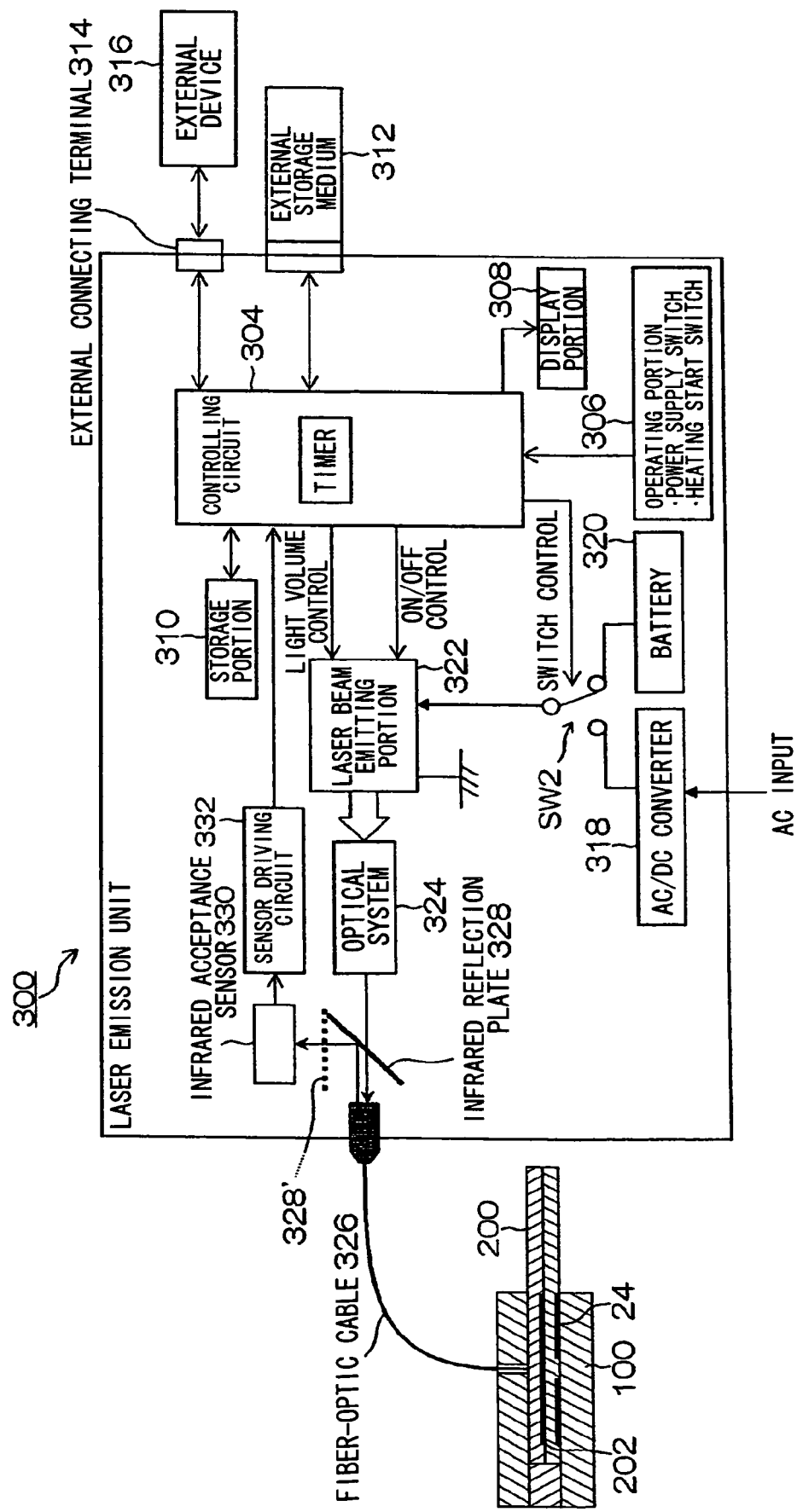
FIG. 22 is a block diagram showing the main configuration of a laser emission unit 300.

FIG. 22 is a block diagram showing the main configuration of a laser emission unit 300. As shown in FIG. 22, the laser emission unit 300 includes a controlling circuit 304, an operating portion 306, a display portion 308, a storage portion 310, an external storage medium 312 and an external connecting terminal 314.

The controlling circuit 304 is a control portion for integrally controlling the laser emission unit 300. The controlling circuit 304 controls the operation of the laser emission unit 300 based on signal inputs from the operating portion 306 and the like. The operating portion 306 includes a power switch of the laser emission unit 300, a heating start switch for starting the radiation of the laser beam from a beam radiation opening 302 and various other operating switches. The display portion 308 is a monitor for displaying various operation menus and set contents and also displaying a warning. The storage portion 310 is an apparatus for storing data, programs and the like necessary to control the laser emission unit 300, which is a memory (a non-volatile memory for instance) built into the laser emission unit 300 for instance. The external storage medium 312 is a storage medium detachable from the power supply unit 50, which is a semiconductor memory such as a memory card, an optical disk such as a CD or a DVD or a magnetic disk such as an HDD for instance. The external connecting terminal 314 is an interface for communication with an external device 316 (such as a personal computer), which is a USB for instance.

Next, the power supply of the laser emission unit 300 will be described. As shown in FIG. 22, the laser emission unit 300 further includes an AC/DC converter circuit 318, a battery 320 and a power changing-over switch SW 2. The laser emission unit 300 can select and use a commercial AC power supply or the built-in battery 320 as the power supply. The power supply to be used can be changed over by an operation input from the operating portion 306. If the operation input for changing over the power supply is performed from the operating portion 306, the power changing-over switch SW 2 is controlled by the controlling circuit 304 so as to change over the power supply to be used.

The AC/DC converter circuit 318 converts an AC input from the commercial AC power supply to a DC input in the case of using the commercial AC power supply as the power supply. The kind of the battery 320 may be either a primary battery or a secondary battery. In the case of using the battery 320 built into the laser emission unit 300 as the power supply, it has an advantage of good portability.

Next, a description will be given as to a control system for controlling the radiation of the laser beam of the laser emission unit 300. As shown in FIG. 22, the laser emission unit 300 further includes a laser beam emitting portion 322, an optical system 324, a fiber-optic cable 326, an infrared reflection plate 328, an infrared acceptance sensor 330 and a sensor driving circuit 332.

The laser beam emitting portion 322 is an apparatus for emitting the laser beam. The laser beam raised by the laser beam emitting portion 322 is collected by the optical system 324 to be guided by the fiber-optic cable 326. The beam radiation opening 302 is formed at the end of the fiber-optic cable 326, and is inserted into the beam introduction opening 102 of the multilayer board 100. The laser beam guided via the fiber-optic cable 326 is radiated on the highly heat-conductive member 202 or the connection patterns 24 of the flexible board 200 so that the solder applied to the surfaces of the connection patterns 24 is heated and melted.

Light volume, intensity, radiation time and the like of the laser beam radiated on the highly heat-conductive member 202 or the connection patterns 24 are set based on heating temperature, heating time and the like set by an operation input from the operating portion 306. It is possible to store the heating temperature, heating time and the like set by the operating portion 306 in the storage portion 310. Thus, it is possible to use the current value, energization time and the like stored in the storage portion 310 on radiation of the laser beam next time.

The light volume, intensity, radiation time and the like of the laser beam radiated on the highly heat-conductive member 202 or the connection patterns 24 may also be automatically set based on the heating profile stored in the external storage medium 312 or the like. Here, the heating profile is the data representing the light volume, intensity and radiation time of the laser beam radiated on the highly heat-conductive member 202 or the connection patterns 24 of the flexible board 200, temporal change thereof or a correlation with temperature change of the highly heat-conductive member 202 or the connection patterns 24, which is set according to the kind of the flexible board 200. The heating profile is calculated based on a difference in the calorific value according to the thickness, material and the like of the flexible board 200 and the pattern width, thickness, material and the like of the connection patterns 24, and further based on the components of the solder used to connect the connection patterns 14 and 24, and the like.

When using the heating profile, the kind of the flexible board 200 is specified by the operating portion 306 first. The controlling circuit 304 reads the heating profile corresponding to the specified flexible board 200 out of the external storage medium 312. It is thereby possible to set the optimal light volume, intensity and radiation time of the laser beam for heating the connection patterns 24.

The procedure for specifying the kind of the flexible board 200 can be as follows for instance. For instance, the flexible board 200 is given a unique identification sign (such as an ID number). On detecting that the heating start switch of the operating portion 306 is on, the controlling circuit 304 causes the display portion 308 to display the input acceptance screen for the identification sign of the flexible board 200. Next, the controlling circuit 304 determines the kind of the flexible board 200 based on the identification sign inputted by the operating portion 306 so as to read out the corresponding heating profile. The flexible board 200 may be given a barcode, a two-dimensional code or the like instead of the identification sign. And an apparatus for reading the barcode or the two-dimensional code may be mounted on the laser emission unit 300 to read the barcode or the two-dimensional code and thereby specify the kind of the flexible board 200.

The heating profile may also be stored in the storage portion 310 built into the laser emission unit 300 instead of the external storage medium 312. The data such as the heating profile is mutually readable and writable between the storage portion 310 and the external storage medium 312. Furthermore, the data such as the heating profile is also mutually readable and writable between the storage portion 310 and the external device 316 (such as a PC).

The highly heat-conductive member 202 or the connection patterns 24 radiates infrared light by heating. The infrared light enters the infrared reflection plate 328 via the fiber-optic cable 326. The infrared reflection plate 328 is a transparent member such as glass IR-coated on the fiber-optic cable 326 side for instance, which transmits the laser beam and reflects the infrared light so that the infrared light having entered the infrared reflection plate 328 is reflected to be received by the infrared acceptance sensor 330.

The infrared acceptance sensor 330 outputs the electrical signal to the sensor driving circuit 332 according to the light volume of the received infrared light. The sensor driving circuit 332 drives the infrared acceptance sensor 330 and amplifies the electrical signal outputted from the infrared acceptance sensor 330 to send it to the controlling circuit 304.

The controlling circuit 304 detects the temperature of the highly heat-conductive member 202 or the connection patterns 24 based on the light volume of the received infrared light. And the controlling circuit 304 exerts feedback control for adjusting the intensity, light volume, radiation time or the like of the laser beam so that the temperature of the highly heat-conductive member 202 or the connection patterns 24 becomes the set temperature.

The storage portion 310 or the external storage medium 312 stores correlation table data on the infrared light volume versus the temperature created by measuring the correlation between the infrared light volume received via the fiber-optic cable 326 and the temperature of the highly heat-conductive member 202 or the connection patterns 24 in advance. The controlling circuit 304 can easily acquire the temperature of the highly heat-conductive member 202 or the connection patterns 24 from the infrared light volume by referring to the correlation table data. The temperature of the highly heat-conductive member 202 or the connection patterns 24 may also be calculated by a formula representing the correlation between the infrared light volume and the temperature.

The infrared reflection plate 328 is provided to be movable, and its position is controlled by the controlling circuit 304. In the case of exerting open-loop control without measuring the temperature of the highly heat-conductive member 202 or the connection patterns 24, the infrared reflection plate 328 is moved to the position of reference numeral 328' in the drawing. In the case of exerting the open-loop control as above, the infrared reflection plate 328 is moved out of a light path of the laser beam so that the loss of the radiated laser beam guided by the fiber-optic cable 326 from the optical system 324 can be reduced.

According to this embodiment, the laser beam is used to heat the highly heat-conductive member 202 or the connection patterns 24 of the flexible board 200. It is also possible, however, to use the light other than the laser beam or the beam for heating such as an electron beam or an ion beam.

According to this embodiment, the light volume of the infrared light is measured to detect the temperature of the highly heat-conductive member 202 or the connection patterns 24. It is also possible, however, to mount a temperature sensor around the beam radiation opening 302 for instance.

Figure 23:
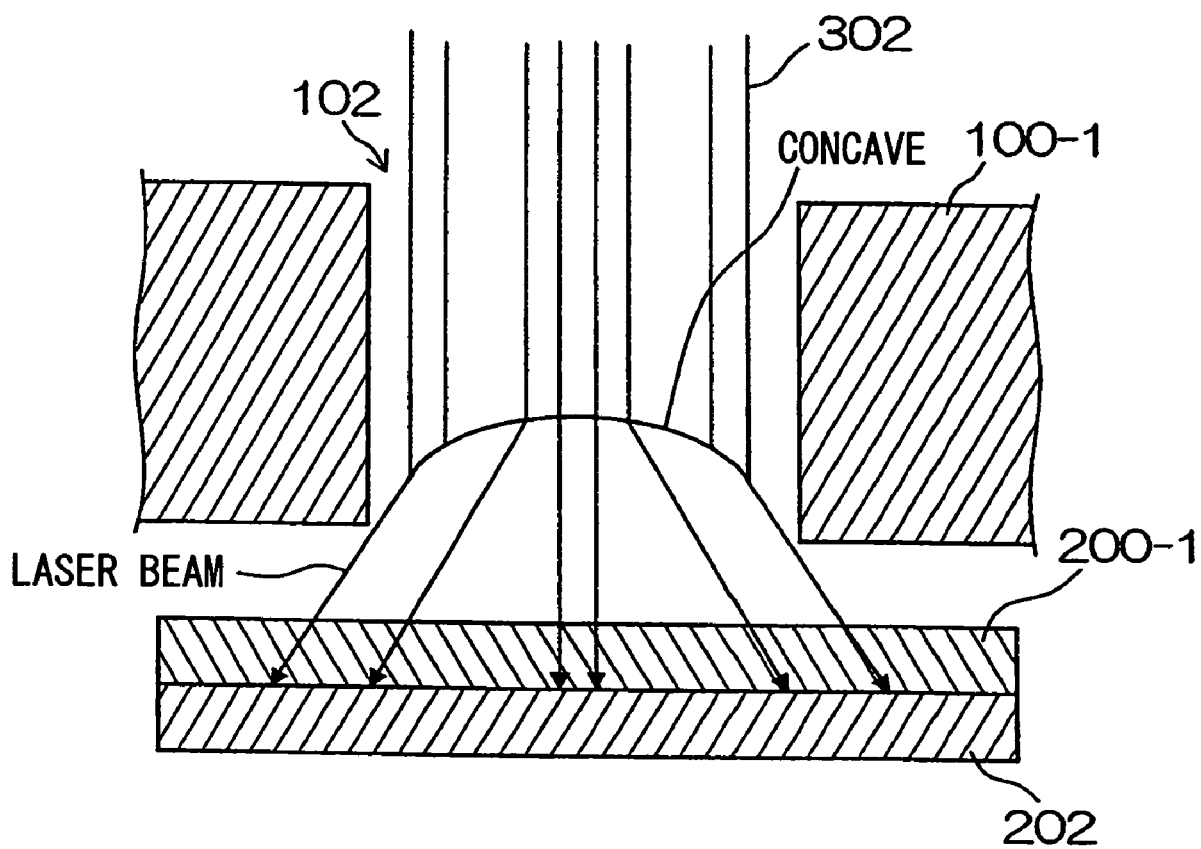
FIG. 23 is a diagram showing a beam radiation opening 302 by enlarging it.

In the case where the area of the highly heat-conductive member 202 or the connection patterns 24 is larger than the bore of the beam radiation opening 302, it is desirable to allow the laser beam to be radiated in a wider range. FIG. 23 is a diagram showing the beam radiation opening 302 by enlarging it. As shown in FIG. 23, the beam radiation opening 302 is formed by shaping the end of the fiber-optic cable 326 like a concave face, a lens, a convex face or a polyhedron. It is thereby possible to expand the area to be radiated with the laser beam on the highly heat-conductive member 202 or the connection patterns 24. It is also possible, by diffusing the laser beam, to realize more even heating which is hardly concentrated. Furthermore, shaping the end of the fiber-optic cable 326 in the above form has the effects of allowing the infrared light radiated from the highly heat-conductive member 202 or the connection patterns 24 to be collected from a wider range and securing detection accuracy of the temperature even in the case where the radiated infrared light is uneven.

According to this embodiment, it is also possible, as with the above embodiment, to provide the IC tag 90 on the flexible board 200 and also provide the IC tag sending and receiving portion 92 and IC tag sending and receiving circuit 94 on the laser emission unit 300 so as to perform the setting of the heating profile.

[Processing Flow of the Laser Emission Unit]

Next, the processing flow of the controlling circuit 304 of the power supply unit 300 will be described with reference to FIG. 24. First, the flexible board 200 is inserted into the board insertion opening 100A of the multilayer board 100. And the positioning is performed so that the connection patterns 14 and 24 become opposed (overlapping) while the beam radiation opening 302 is inserted into the beam introduction opening 102 of the multilayer board 100. If the controlling circuit 304 detects that the power switch of the operating portion 306 is on (step S100) and the heating start switch for starting the radiation of the laser beam is further on (step S102), it displays the acceptance screen for specifying the kind of the flexible board 200 on the display portion 308. The multilayer board 100 and flexible board 200 are is identifiable by the identification signs, one-dimensional codes, two-dimensional codes and the like as with the above embodiment. On accepting the specification of the kind of the flexible board 200, the controlling circuit 304 determines whether or not there is the heating profile corresponding to the kind of the flexible board 200 specified by the external storage medium 312 or the like (step S104). In the case where there is the heating profile corresponding to the specified kind of the flexible board 200 (step S104: Yes), the controlling circuit 304 reads out the heating profile and sets the heating temperature and heating time of the highly heat-conductive member 202 or the connection patterns 24 based on the read heating profile (step S106). In the case where the kind of the flexible board 200 is not inputted to the acceptance screen or in the case where there is no heating profile corresponding to the specified kind of the flexible board 200 (step S104: No), it displays the setting screen for setting the heating temperature and heating time of the highly heat-conductive member 202 or the connection patterns 24 so as to set the heating temperature and heating time of the highly heat-conductive member 202 or the connection patterns 24 based on the manual operation from the operating portion 306 (step S108).

Next, the controlling circuit 304 outputs a predetermined volume of the laser beam, measures the infrared light volume radiated from the highly heat-conductive member 202 or the connection patterns 24 of the flexible board 200 and detects the temperature of the highly heat-conductive member 202 or the connection patterns 24 (step S110). If the temperature detected in the step S110 (detected temperature) is equal to or lower than the set temperature (step S112: No), it increases the volume of the laser beam by the predetermined volume (step S114). If the detected temperature is higher than the set temperature (step S112: Yes), it reduces the volume of the laser beam by the predetermined volume (step S116). The predetermined volume in the steps S114 and S116 may be constant. It is also possible, however, to calculate the volume of the laser beam and the radiation time to be the set temperature based on the detected infrared light volume and the current volume of the laser beam so as to set the calculated value as the predetermined volume. The controlling circuit 304 performs the processing of the steps S112 to S116 every predetermined time (step S120) so as to increase the temperature of the highly heat-conductive member 202 or the connection patterns 24 stepwise and maintain it. As for the predetermined time in the steps S120, the time for reaching the range of the set temperature in normal operation is set.

Next, each time the predetermined time elapses (step S120: Yes), it is detected whether or not the detected temperature is within the predetermined range (step S122). If the detected temperature is within the predetermined range (step S122: Yes), it returns to the processing of the step S112. If the detected temperature is out of the predetermined range (step S122: No), that is, if the detected temperature is lower than the predetermined range for instance, it may be assumed that the laser beam is radiated and there is neither highly heat-conductive member 202 nor the connection patterns 24 within the range capable of detecting the infrared light. If the detected temperature is higher than the predetermined range, abnormal overheating or the like is assumed. For this reason, the controlling circuit 304 displays a warning message indicating an abnormal state on the display portion 308 (step S124), and stops the radiation of the laser beam (step S126). It is thereby possible to prevent the abnormal overheating and the like so as to secure safety.

The processing from the steps S111 to S122 is repeated until the set heating time of the laser beam elapses (step S118: Yes) to stop the radiation of the laser beam (step S126). Thus, the solder 26 applied to the surfaces of the connection patterns 24 of the flexible board 200 naturally dissipates heat and coagulates so that connections are made between the connection patterns 14 and 24 respectively.

When separating the multilayer board 100 from the flexible board 200, the processing from the step S100 to S124 should be performed in the state where the multilayer board 100 and the flexible board 200 are connected. And the flexible board 200 should be pulled out of the board insertion opening 100A to stop the radiation of the laser beam at the stage where the solder connecting the connection patterns 14 with 24 is sufficiently heated and melted (step S126).

What is claimed is:

1. A wiring board having a first board provided with a first wiring pattern and a second board provided with a second wiring pattern while the first wiring pattern and the second wiring pattern are electrically connected, wherein
   the first board includes:
      a board insertion opening in which the second board is inserted; and
      a first connection pattern provided inside the board insertion opening and electrically connected to the first wiring pattern,
   the second board includes:
      an inserting portion to be inserted into the board insertion opening of the first board; and
      a second connection pattern provided at a position opposed to the first connection pattern in the case where the inserting portion of the second board is inserted into the board insertion opening of the first board and electrically connected to the second wiring pattern, and
   the wiring board comprises:
      a solder or a brazing filler metal applied at least to a surface of one of the first connection pattern and second connection pattern; and
   a heat generating device incorporated as part of the first board or second board, which generates heat by energization and melts the solder or the brazing filler metal to connect the first connection pattern with the second connection pattern.

2. The wiring board according to claim 1, wherein the heat generating device is provided on a backside surface of the surface provided with the second connection pattern in the inserting portion.

3. The wiring board according to claim 1, wherein the second board is a multilayer board having multiple layers laminated therein and the heat generating device is provided between the multiple layers.

4. The wiring board according to claim 2, wherein the heat generating device is provided at a position overlapping the second connection pattern.

5. The wiring board according to claim 4, wherein the heat generating device is an electrothermal pattern or a filiform heating element for generating heat by energization and is provided according to a form of the second connection pattern.

6. The wiring board according to claim 5, wherein the electrothermal pattern or the filiform heating element is provided on the backside of the second connection pattern or in proximity thereto; and the second board is provided with a wiring of low electrical resistance for supplying electric power to the electrothermal pattern or the filiform heating element.

7. The wiring board according to claim 1, wherein the heat generating device is grounded on operation of a circuit configured by connecting the first wiring pattern with the second wiring pattern.

8. The wiring board according to claim 1, wherein the heat generating device is grounded via a capacitor.

9. The wiring board according to claim 1, further comprising
   a smoothing device which is formed further on an insertion end side than the second connection pattern on the surface of the second board having the second connection pattern formed thereon and heated by energization on insertion or separation to smooth the surface of the solder or the brazing filler metal attached to the first connection pattern.

10. The wiring board according to claim 5 further comprising:
    a third wiring pattern to supply current to the electrothermal pattern or the filiform heating element, wherein
    a connection point between the electrothermal pattern or the filiform heating element and the third wiring pattern is placed inside the board insertion opening.

11. The wiring board according to claim 1, further comprising
    a high-heat expanding member to be expanded by heating which is provided on a surface different from the surface of the second board having the second connection pattern formed thereon.

12. The wiring board according to claim 11, wherein the high-heat expanding member includes at least one substance out of copper, aluminum, iron and ceramics.

13. The wiring board according to claim 11, wherein the high-heat expanding member is grounded.

14. The wiring board according to claim 1, wherein the second board is formed by a material including the substance to be expanded by heating.

15. The wiring board according to claim 14, wherein the second board contains ceramics of a high heat expansion coefficient.

16. The wiring board according to claim 1, wherein the first board further includes a first reinforcing pad provided inside the board insertion opening and electrically unconnected to the first wiring pattern,
    the second board further includes a second reinforcing pad provided at the position opposed to the first reinforcing pad and electrically unconnected to the second wiring pattern in the case where the inserting portion of the second board is inserted into the board insertion opening of the first board, and
    the solder or the brazing filler metal is applied to the surface of at least one of the first reinforcing pad and second reinforcing pad.

17. The wiring board according to claim 1, wherein the second board farther includes a heating profile transmitting device which records a heating profile on heating the solder or the brazing filler metal and transmits the heating profile to a wiring board connecting apparatus.

18. The wiring board according to claim 17, wherein the heating profile transmitting device is an IC tag.

19. A wiring board including a first board provided with a first wiring pattern and a second board provided with a second wiring pattern while the first wiring pattern and the second wiring pattern are electrically connected, wherein the first board includes:
- a board insertion opening in which the second board is inserted;
- a first connection pattern provided inside the board insertion opening and electrically connected to the first wiring pattern; and
- a beam introduction opening for introducing a heating beam for heating the first connection pattern, the second board includes:
- an inserting portion to be inserted into the board insertion opening of the first board; and
- a second connection pattern provided at a position on the inserting portion opposed to the first connection pattern in the case where the inserting portion of the second board is inserted into the board insertion opening of the first board and electrically connected to the second wiring pattern, and the wiring board comprises:
- a solder or a brazing filler metal applied at least to a surface of one of the first connection pattern and second connection pattern and heated and melted by the heating beam introduced from the beam introduction opening to connect the first connection pattern with the second connection pattern.

20. The wiring board according to claim 19, wherein the beam introduction opening is formed on the backside of the first connection pattern on the first board.

21. The wiring board according to claim 19, wherein the beam introduction opening is formed by at least one to penetrate a wall surface of the board insertion opening of the first board and the second board further includes a heat conduction member consisting of a highly heat-conductive material and provided on a surface facing the beam introduction opening in the case where the inserting portion of the second board is inserted into the board insertion opening of the first board.

22. The wiring board according to claim 19, wherein the beam introduction opening is formed by at least one to penetrate a wall surface of the board insertion opening of the first board; and the second board is a multilayer board having multiple layers laminated therein and further includes a heat conduction member made of a highly heat-conductive material provided to a layer inside the inserting portion.

23. The wiring board according to claim 21, wherein the heat conduction member includes at least one substance out of copper, aluminum and iron.

24. The wiring board according to claim 19, further comprising
a high-heat expanding member to be expanded by heating which is provided on a surface different from the surface of the second board having the second connection pattern formed thereon.

25. The wiring board according to claim 19, wherein the second board is formed by a material including the substance to be expanded by heating.

26. The wiring board according to claim 19, wherein the first board farther includes a first reinforcing pad provided inside the board insertion opening and electrically unconnected to the first wiring pattern, the second board farther includes a second reinforcing pad provided at the position opposed to the first reinforcing pad and electrically unconnected to the second wiring pattern in the case where the inserting portion of the second board is inserted into the board insertion opening of the first board, and the solder or the brazing filler metal is applied to the surface of at least one of the first reinforcing pad and second reinforcing pad.

27. The wiring board according to claim 19, wherein the second board further includes a heating profile transmitting device which records a heating profile on heating the solder or the brazing filler metal and transmits the heating profile to a wiring board connecting apparatus.

28. A method for manufacturing a wiring board comprising a first board provided with a first wiring pattern and a second board provided with a second wiring pattern while the first wiring pattern and the second wiring pattern are electrically connected, comprising:

(1a) reading out a heating profile by a wiring board connecting apparatus;

(1b) setting current value to be supplied to a heat generating device which is comprised by the wiring board and which generates heat by energization and energization time based on said heating profile;

(1c) when an inserting portion of the second board is inserted into a board insertion opening of the first board so that a first connection patterns which is electrically connected to the first wiring pattern and is provided inside the board insertion opening of the first board and a second connection patterns which is electrically connected to the second wiring pattern and is provided at a position opposed to the first connection pattern in the ease where the inserting portion of the second board is inserted into the board insertion opening of the first board become opposed, outputting the current to the heat generating device from a power supply of the wiring board connecting apparatus according to the current value set in (1b) and heating a solder or a brazing filler metal which is applied to at least one surface of the first connection pattern and the second connection pattern so as to melt the solder or the brazing filler metal; and (1d) stopping the current output to the heat generating device from the wiring board connecting apparatus if the energization time set in (1b) elapses.

29. The method according to claim 28, wherein the heating profile includes data representing current value or voltage value supplied to the heat generating device.

30. The method according to claim 28, wherein the heating profile includes data representing energization time.

31. The method according to claim 28, wherein the heating profile includes data on temporal change in the current value or the voltage value supplied to the heat generating device.

32. The method according to claim 28, wherein the heating profile is calculated based on a difference in the calorific value according to properties of at least one of the board, the connection pattern or the solder or the brazing filler material.

33. The method according to claim 28, further comprising:

(1e) outputting the current to the heat generating device from the wiring board connecting apparatus and heating the solder or the brazing filler metal which connects the first connection pattern and the second connection pattern so as to melt it; and (1f) stopping the current output to the heat generating device if the inserting portion of the second board is pulled out of the board insertion opening of the first board after (1e).

34. The method according to claim 28, wherein (1a) comprises
- (1g) accepting the specification of the kind of the first board and the second board by the wiring board connecting apparatus; and
- (1h) reading out the heating profile corresponding to the kind of the first board and the second board specified in (1g) out of a heating profile recording device which is comprised by the wiring board connecting apparatus and records the heating profile.

35. The method according to claim 28, wherein (1a) comprises:
- (1i) receiving the heating profile from a heating profile transmitting device provided on the board by the wiring board connecting apparatus.

36. The method according to claim 35, wherein the heating profile is received by a heating profile receiving device which is provided to a power supply probe comprising the wiring board connecting apparatus and said heating profile receiving device is connected to the heat generating device of the board or in proximity to the power supply probe.

37. The method according to claim 35, further comprising:
- (1j) measuring a voltage applied to the heat generating device; and
- (1k) stopping the energization to the heat generating device in the case where the measured voltage is out of a predetermined range of values.

38. The method according to claim 37, further comprising:
- (1l) outputting a warning when the energization stops in (1k).

39. A method for manufacturing a wiring board comprising a first board provided with a first wiring pattern and a second board provided with a second wiring pattern while the first wiring pattern and the second wiring pattern are electrically connected, comprising:
- (2a) reading out a heating profile by a wiring board connecting apparatus;
- (2b) setting heating temperature and heating time based on said heating profile;
- (2c) when an inserting portion of the second board is inserted into a board insertion opening of the first board so that a first connection patterns which is electrically connected to the first wiring pattern and is provided inside the board insertion opening of the first board and a second connection patterns which is electrically connected to the second wiring pattern and is provided at a position opposed to the first connection pattern in the case where the inserting portion of the second board is inserted into the board insertion opening of the first board become opposed, outputting a predetermined volume of heating beam from a heating beam source of the wiring board connecting apparatus through a beam introduction opening on the first board and heating a solder or a brazing filler metal which is applied to at least one surface of the first connection pattern and the second connection pattern so as to melt the solder or the brazing filler metal;
- (2d) controlling heat applied to the connection patterns based on the heating profile; and
- (2e) stopping the heating beam output if the heating time set in elapses.

40. The method according to claim 39, wherein the heating profile includes data representing light volume or intensity of the heating beam introduced to the connection pattern.

41. The method according to claim 39, wherein the heating beam source includes:
a laser source for generating a laser beam; and
an optical fiber for radiating the laser beam via the beam introduction opening formed on the board.

42. The method according to claim 41, wherein an end of the optical fiber is concave.

43. The method according to claim 41, wherein further comprising:
- (2n) calculating a temperature of the region by a temperature calculating device of the wiring board connecting apparatus based on the infrared ray which is generated in a region for which the laser beam is introduced and is guided by the optical fiber.

44. The method according to claim 43, further comprising:
- (2o) calculating the temperature of the region by predetermined time; and
- (2p) stopping the radiation of the laser beam in the case where the calculated temperature is out of a predetermined range of values.

45. The method according to claim 44, further comprising:
- (2q) outputting a warning when the radiation of the laser beam stops in (2p).

46. The method according to claim 39, wherein the heating profile includes data representing radiating time of the heating beam introduced to the connection pattern.

47. The method according to claim 39, wherein the heating profile includes data representing temporal change of the light volume or the intensity of the heating beam introduced to the connection pattern.

48. The method according to claim 39, wherein the heating profile is calculated based on a difference in the calorific value according to properties of at least one of the board, the connection pattern or the solder or brazing filler material.

49. The method according to claim 39 further comprising:
- (2f) outputting the heating beam and heating the solder or the brazing filler metal which connects the first connection pattern and the second connection pattern so as to melt it; and
- (2g) stopping the heating beam output if the inserting portion of the second board is pulled out of the board insertion opening of the first board after (2f).

50. The method according to claim 39, wherein (2a) comprises:
- (2h) accepting the specification of the kind of the first board and the second board by the wiring board connecting apparatus; and
- (2i) reading out the heating profile corresponding to the kind of the first board and the second board specified in (2h) out of a heating profile recording device which is comprised by the wiring board connecting apparatus and records the heating profile.

51. The method according to claim 39, wherein (2a) comprises:
- (2j) receiving the heating profile from a heating profile transmitting device provided on the board.

52. The method according to claim 39, wherein (2d) comprises:
- (2k) detecting the temperature of the connection pattern;
- (2l) if the temperature detected in (2k) is equal to or lower than the temperature set in (2b), increasing the volume of the heating beam; and
- (2m) if the temperature detected in (2k) is higher than the temperature set in (2b), reducing the volume of the heating beam.

* * * * *